(12) United States Patent
Kwon et al.

(10) Patent No.: US 9,190,407 B2
(45) Date of Patent: Nov. 17, 2015

(54) SEMICONDUCTOR DEVICE AND METHOD FOR FABRICATING THE SAME

(71) Applicants: Byoung-Ho Kwon, Hwaseong-si (KR); Cheol Kim, Hwaseong-si (KR); Ho-Young Kim, Seongnam-si (KR); Se-Jung Park, Hwaseong-si (KR); Myeong-Cheol Kim, Suwon-si (KR); Bo-Kyeong Kang, Seoul (KR); Bo-Un Yoon, Seoul (KR); Jae-Kwang Choi, Suwon-si (KR); Si-Young Choi, Seongnam-si (KR); Suk-Hoon Jeong, Suwon-si (KR); Geum-Jung Seong, Seoul (KR); Hee-Don Jeong, Hwaseong-si (KR); Yong-Joon Choi, Seoul (KR); Ji-Eun Han, Incheon (KR)

(72) Inventors: Byoung-Ho Kwon, Hwaseong-si (KR); Cheol Kim, Hwaseong-si (KR); Ho-Young Kim, Seongnam-si (KR); Se-Jung Park, Hwaseong-si (KR); Myeong-Cheol Kim, Suwon-si (KR); Bo-Kyeong Kang, Seoul (KR); Bo-Un Yoon, Seoul (KR); Jae-Kwang Choi, Suwon-si (KR); Si-Young Choi, Seongnam-si (KR); Suk-Hoon Jeong, Suwon-si (KR); Geum-Jung Seong, Seoul (KR); Hee-Don Jeong, Hwaseong-si (KR); Yong-Joon Choi, Seoul (KR); Ji-Eun Han, Incheon (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/569,597

(22) Filed: Dec. 12, 2014

(65) Prior Publication Data

US 2015/0097251 A1    Apr. 9, 2015

Related U.S. Application Data

(63) Continuation of application No. 14/270,315, filed on May 5, 2014, now Pat. No. 8,916,460.

(30) Foreign Application Priority Data

Aug. 7, 2013    (KR) .................... 10-2013-0093690

(51) Int. Cl.

| | |
|---|---|
| *H01L 27/088* | (2006.01) |
| *H01L 29/78* | (2006.01) |
| *H01L 29/66* | (2006.01) |
| *H01L 21/8238* | (2006.01) |
| *H01L 21/8234* | (2006.01) |
| *H01L 29/49* | (2006.01) |

(52) U.S. Cl.
CPC .... *H01L 27/0886* (2013.01); *H01L 21/823431* (2013.01); *H01L 21/823437* (2013.01); *H01L 21/823807* (2013.01); *H01L 21/823814* (2013.01); *H01L 21/823821* (2013.01); *H01L 29/6656* (2013.01); *H01L 29/66545* (2013.01); *H01L 29/66795* (2013.01); *H01L 29/49* (2013.01); *H01L 29/78* (2013.01)

(58) Field of Classification Search
CPC ..................... H01L 27/0886; H01L 29/66545; H01L 29/6656; H01L 29/49; H01L 29/78; H01L 21/823431; H01L 21/823437
USPC ............... 257/192, 288, 347, 369, 401, 412, 257/E27.061, E29.273, E21.444, E21.632; 438/3, 280, 283, 595
See application file for complete search history.

(56) References Cited

U.S. PATENT DOCUMENTS

| | | |
|---|---|---|
| 6,372,622 B1 | 4/2002 | Tan et al. |
| 6,624,496 B2 | 9/2003 | Ku et al. |
| 7,141,856 B2 | 11/2006 | Lee et al. |
| 7,160,780 B2 | 1/2007 | Lee et al. |
| 7,186,599 B2 | 3/2007 | Ahmed et al. |

| | | | |
|---|---|---|---|
| 7,528,033 | B2 | 5/2009 | Kim |
| 7,728,381 | B2 | 6/2010 | Kahng et al. |
| 7,816,208 | B2 | 10/2010 | Kujirai |
| 7,923,337 | B2 | 4/2011 | Chang et al. |
| 8,026,138 | B2 | 9/2011 | Lee |
| 8,258,572 | B2 | 9/2012 | Liaw |
| 8,319,311 | B2 | 11/2012 | Chen et al. |
| 8,362,575 | B2 | 1/2013 | Kwok et al. |
| 8,367,498 | B2 | 2/2013 | Chang et al. |
| 2009/0085121 | A1* | 4/2009 | Park et al. .................. 257/368 |
| 2011/0103125 | A1* | 5/2011 | Tomishima .................. 365/72 |
| 2012/0049294 | A1 | 3/2012 | Chen et al. |
| 2012/0217583 | A1 | 8/2012 | Zhu et al. |
| 2012/0315732 | A1 | 12/2012 | Kang et al. |
| 2013/0052778 | A1 | 2/2013 | Liao et al. |
| 2013/0056795 | A1 | 3/2013 | Wu et al. |
| 2013/0056826 | A1 | 3/2013 | Liu et al. |
| 2013/0175638 | A1* | 7/2013 | Ho et al. .................. 257/401 |
| 2013/0187237 | A1 | 7/2013 | Yu et al. |
| 2014/0001575 | A1 | 1/2014 | Adams et al. |
| 2014/0103453 | A1* | 4/2014 | Mor et al. .................. 257/401 |
| 2014/0217502 | A1* | 8/2014 | Chang et al. .................. 257/347 |
| 2014/0217505 | A1* | 8/2014 | Lin .................. 257/347 |

FOREIGN PATENT DOCUMENTS

| | | |
|---|---|---|
| KR | 10-2007-0082921 A | 8/2007 |
| KR | 10-2008-0029268 A | 4/2008 |
| KR | 10-2011-0114857 A | 10/2011 |

* cited by examiner

*Primary Examiner* — Dao H Nguyen

(74) *Attorney, Agent, or Firm* — Muir Patent Law, PLLC

(57) ABSTRACT

Semiconductor devices may include a semiconductor substrate with a first semiconductor fin aligned end-to-end with a second semiconductor with a recess between facing ends of the first and second semiconductor fins. A first insulator pattern is formed adjacent sidewalls of the first and second semiconductor fins and a second insulator pattern is formed within the first recess. The second insulator pattern may have a top surface higher than a top surface of the first insulator pattern, such as to the height of the top surface of the fins (or higher or lower). First and second gates extend along sidewalls and a top surface of the first semiconductor fin. A dummy gate electrode may be formed on the top surface of the second insulator. Methods for manufacture of the same and modifications are also disclosed.

19 Claims, 24 Drawing Sheets

SEMICONDUCTOR DEVICE AND METHOD FOR FABRICATING THE SAME

CROSS-REFERENCE TO RELATED APPLICATION

This application is a continuation of and claims priority to U.S. patent application Ser. No. 14/270,315 filed on May 5, 2014 which claims priority from Korean Patent Application No. 10-2013-0093690 filed on Aug. 7, 2013 in the Korean Intellectual Property Office, and all the benefits accruing therefrom under 35 U.S.C. 119, the contents of each of which in its entirety are herein incorporated by reference.

BACKGROUND

1. Technical Field

The present invention relates to a semiconductor device and a fabricating method thereof, and more particularly to a semiconductor device using a three-dimensional channel and a fabricating method thereof.

2. Description of the Related Art

As one of scaling techniques for increasing the density of integrated circuit devices, a transistor has been proposed, in which a fin- or nanowire-shaped active pattern is formed with a substrate and a gate is then formed on a surface of the active pattern.

Since the transistor uses a three-dimensional (3D) channel, scaling of the multi-gate transistor can be achieved. In addition, current controlling capability can be improved and a short channel effect (SCE), in which an electric potential of a channel region is affected by a drain voltage, can be effectively suppressed.

SUMMARY

The present invention is directed to semiconductor devices, systems and methods of manufacturing. In some embodiments, a semiconductor device comprises a semiconductor substrate with a first semiconductor fin and a second semiconductor fin, the first and second semiconductor fins extending, with respect to a top down view, in a first direction and extending along a same line and defining a first recess between facing ends of the first and second semiconductor fins; a first insulator pattern formed in the first recess and having a top surface at least as high as a top surface of the first semiconductor fin; a first gate electrode extending along a first sidewall of the first semiconductor fin, the top surface of the first semiconductor fin and a second sidewall of the first semiconductor fin; a second gate electrode extending along a first sidewall of the second semiconductor fin, a top surface off the second semiconductor fin and a second sidewall of the second semiconductor fin; and a first dummy gate electrode formed on the top surface of the first insulator pattern at the first recess.

With respect to the top down view, the first gate electrode, the second gate electrode and the first dummy gate electrode may extend in a second direction perpendicular to the first direction.

With respect to a first cross section of the first insulator pattern taken in a direction perpendicular to the second direction at the first recess, the first insulator pattern may include a first portion having substantially linear sidewalls and a second portion, on and connecting with the first portion, having sidewalls that are not linearly aligned with the sidewalls of the first portion, a maximum width of the second portion in the first direction being greater than a maximum width of the first portion in the first direction.

The sidewalls of the second portion may be substantially parallel to each other.

A sidewall of the second portion may comprise a first part having a first angle with respect to horizontal and a second part having a second angle with respect to horizontal. The first part may be below the second part and the first angle may be less than the second angle. The first part may be substantially horizontal. The second part may be substantially vertical.

The semiconductor device may further comprise a third semiconductor fin parallel to and adjacent the first semiconductor fin.

The first gate electrode may extend along a first sidewall of the third semiconductor fin, over a top surface off the third semiconductor fin, along a second sidewall of the third semiconductor fin and in a gap between the first semiconductor fin and the third semiconductor fin.

The semiconductor device may further comprise a fourth semiconductor fin parallel to and adjacent the second semiconductor fin.

The second gate electrode may extend along a first sidewall of the fourth semiconductor fin, over a top surface off the fourth semiconductor fin, along a second sidewall of the fourth semiconductor fin and in a gap between the second semiconductor fin and the fourth semiconductor fin.

The first dummy gate electrode may extend between the first recess to a second recess between facing ends of the third and fourth semiconductor fins.

The portion of the first dummy gate electrode extending between the first recess to the second recess, a bottom surface of the first dummy gate electrode may be at least as high as the top surface of the first semiconductor fin.

The insulator may have a "T" shape cross section or a quadrilateral shape cross section, such as a rectangle or trapezoidal.

A source/drain may be formed with the first fin and extending over a top surface of the second portion of the first insulator pattern. The source/drain may extend along a lower surface and a side surface of the second portion of the first insulator pattern.

The first dummy gate electrode may include metal. All the metal of the first dummy gate electrode may be located directly above the second insulator pattern.

The semiconductor device may further comprise a third semiconductor fin and a fourth semiconductor fin. The third and fourth semiconductor fins may extend, with respect to a top down view, in the first direction and extend along a same line and defining a second recess between facing ends of the third and fourth semiconductor fins. A second insulator pattern may be formed in the second recess and have a top surface at least as high as a top surface of the third semiconductor fin.

With respect to a second cross section of the second insulator pattern taken in a direction perpendicular to the second direction at the second recess, the second insulator pattern may include substantially linear sidewalls extending from a top surface of the second insulator pattern and extending along a majority of the height of the second insulator pattern. The linear sidewalls of the second insulator pattern may be substantially vertical.

A second dummy gate electrode may be formed on the second insulator pattern and including metal. With respect to the second cross section, all metal of the second dummy gate electrode may be located directly above the second insulator pattern.

With respect to the second cross section, the dummy gate electrode may be the only dummy gate electrode on the second insulator pattern.

A second dummy gate electrode and a third dummy gate electrode may be formed on the second insulator pattern. The second dummy gate electrode may be formed on the third semiconductor fin, and the third dummy gate electrode is formed on the fourth semiconductor fin. The second dummy gate electrode may comprise metal at least a portion of which is located directly above the third semiconductor fin and the third dummy gate electrode comprise metal at least a portion of which is located directly above the fourth semiconductor fin. The metal of the second dummy gate electrode and the metal off the third dummy gate electrode may be located directly above respective sidewalls of the second insulator pattern.

The first dummy gate electrode may be the only dummy gate electrode on the first insulator pattern.

Semiconductor devices disclosed herein may comprise a semiconductor substrate with a first semiconductor fin and a second semiconductor fin, the first and second semiconductor fins extending, with respect to a top down view, in a first direction and extending along a same line and defining a first recess between facing ends of the first and second semiconductor fins; a first insulator pattern adjacent sidewalls of the first and second semiconductor fins; a second insulator pattern within the first recess; a first gate electrode extending along sidewalls and a top surface of the first semiconductor fin; a second gate electrode extending along sidewalk and a top surface of the second semiconductor fin; and a first dummy gate electrode formed on the top surface of the second insulator. The top surface of the second insulator pattern at the first recess is higher than a top surface of the first insulator pattern.

With respect to a cross section of the second insulator patter taken along the first direction, the remaining insulator may have a T-shape.

Systems are disclosed including all or some of the above devices.

Methods are also disclosed for forming all or some of the above devices and systems. In some embodiments, a method of manufacturing a semiconductor device comprises providing a semiconductor substrate with a first semiconductor fin and a second semiconductor fin, the first and second semiconductor fins extending, with respect to a top down view, in a first direction and extending along a same line and defining a first recess between facing ends of the first and second semiconductor fins; forming a first insulator pattern about sidewalls of the first and second semiconductor fins and in the first recess; forming a second insulator pattern on the first insulator pattern at a location above the first recess; etching the first insulator pattern and the second insulator pattern so that the top surfaces of the first and second fins extend above a top surface of the etched first insulator pattern and so that a top surface of remaining insulator in the first recess is above the top surface of the etched first insulator pattern; forming a first gate electrode to extend over the first semiconductor fin, a second gate electrode to extend over the second semiconductor fin, and a first dummy gate to extend over the remaining insulator in the first recess.

Forming a second insulator pattern on the first insulator pattern may comprise forming a hard mask layer over the first and second semiconductor fins and the first insulator pattern; forming an opening in the hard mask layer over the first recess, the opening being located over facing ends of the first and second semiconductor fins; depositing an insulator layer over the hard mask layer and in the opening in the hard mask layer; and removing the insulator layer over the hard mask layer to form the second insulator pattern.

The step of removing the insulator layer over the hard mask layer may comprise a planarizing etching of the insulator layer to expose the hard mask layer.

The method may further comprise etching portions of the first and second semiconductor fins exposed by the opening in the hard mask layer.

The opening in the hard mask layer may expose the facing ends of the first and second semiconductor fins.

The opening may be linearly shaped and extends past plural pairs of neighboring parallel fins.

The method may further comprise forming the second insulator pattern on the first insulator pattern in the linearly shaped opening; etching the first insulator pattern and the second insulator pattern so the remaining insulator extends along a length corresponding to the linearly shaped opening; and forming the first gate electrode above the remaining insulator.

With respect to a cross section of the remaining insulator taken along the first direction, the remaining insulator has a T-shape.

These and other objects of the present invention will be described in or be apparent from the following description of the preferred embodiments.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION OF THE EMBODIMENTS

Figure 1A:
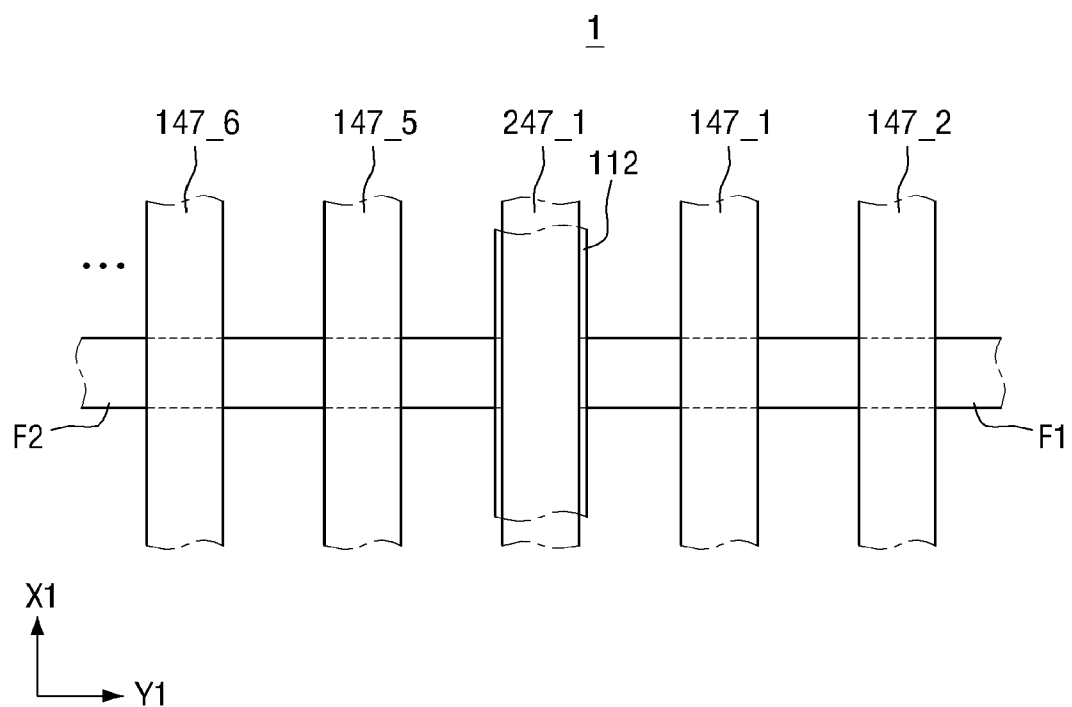
FIGS. 1A and 1B are plan views of a semiconductor device relating to a first embodiment of the present invention.

Advantages and features of the present invention and methods of accomplishing the same may be understood more readily by reference to the following detailed description of preferred embodiments and the accompanying drawings. The present invention may, however, be embodied in many different forms and should not be construed as being limited to the example embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, the thickness of layers and regions may be exaggerated for clarity. Like numbers refer to like elements throughout. Devices and methods of forming devices according to various embodiments described herein may be embodied in microelectronic devices such as integrated circuits, wherein a plurality of devices according to various embodiments described herein are integrated in the same microelectronic device. Accordingly, cross-sectional view(s) illustrated herein (even if illustrated in a single direction or orientation) may exist in different directions or orientations (which need not be orthogonal or related as set forth in the described embodiments) in the microelectronic device. Thus, a plan view of the microelectronic device that embodies devices according to various embodiments described herein may include a plurality of the devices in an array and/or in a two-dimensional pattern having orientations that may be based on the functionality or other design considerations of the microelectronic device. The cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and/or transistor structures (and/or memory cell structures, gate structures, etc., as appropriate to the case) which may have a variety of orientations It will be understood that when an element or layer is referred to as being "on" or "connected to" another element or layer, it can be directly on or connected to the other element or layer or intervening elements or layers may be present. In contrast, when an element is referred to as being "directly on" or "directly connected to" another element or layer, there are no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items and may be abbreviated at "/".

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

It will be understood that, although the terms first, second, etc. may be used herein to describe various elements, these elements should not be limited by these terms. These terms are only used to distinguish one element from another element. Thus, for example, a first element, a first component or a first section discussed or claimed below could be termed or claimed as a second element, a second component or a second section without departing from the teachings of the present invention.

The present invention will be described with reference to perspective views, cross-sectional views, and/or plan views, in which preferred embodiments of the invention are shown. Thus, the profile of an exemplary view may be modified according to manufacturing techniques and/or allowances. That is, the embodiments of the invention are not intended to limit the scope of the present invention but cover all changes and modifications that can be caused due to a change in manufacturing process. Thus, features shown in the drawings may be illustrated in schematic form and the shapes of the regions may be exemplary. Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

Figure 2A:
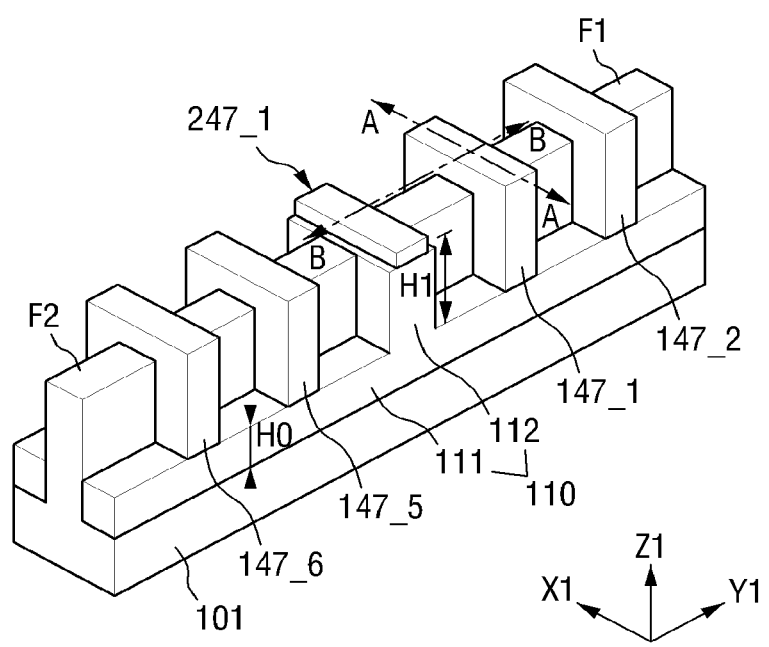
FIGS. 2A and 2B are perspective views of a semiconductor device relating to a first embodiment of the present invention.
Figure 3:
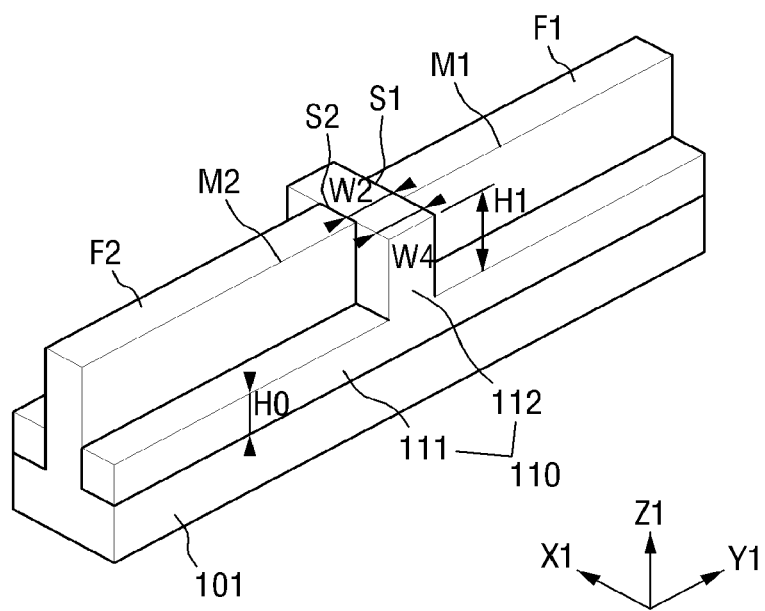
FIG. 3 is a partially perspective view illustrating a fin and a field insulation film of the semiconductor device shown in FIGS. 1A and 2A.
Figure 4:
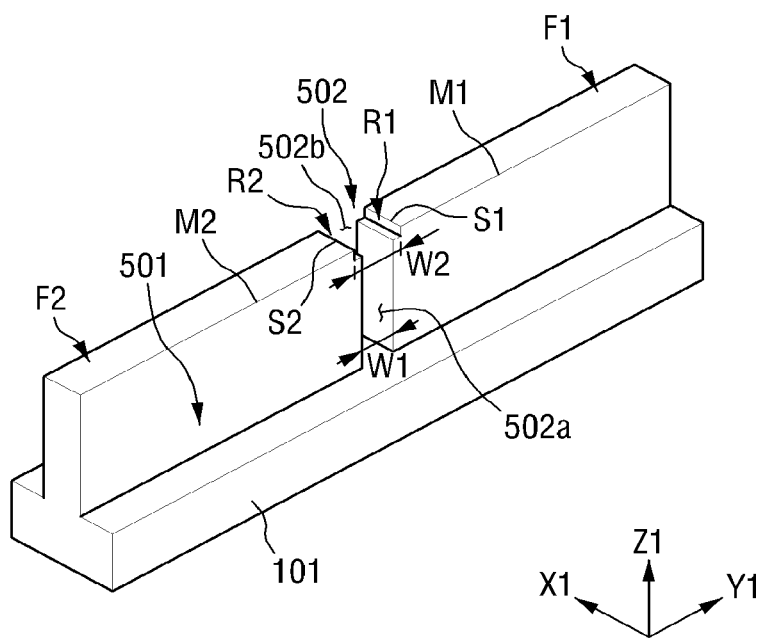
FIG. 4 is a partially perspective view illustrating a fin, a first trench and a second trench of the semiconductor device shown in FIGS. 1A and 2A.
Figure 5A:
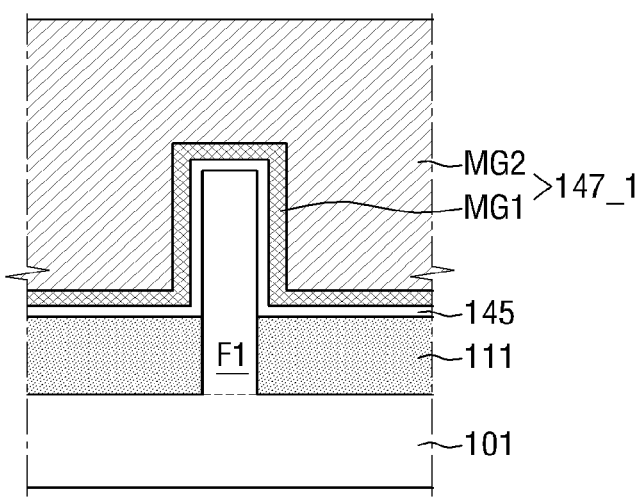
FIG. 5A is a cross-sectional view taken along line A-A of FIG. 2A.
Figure 6:
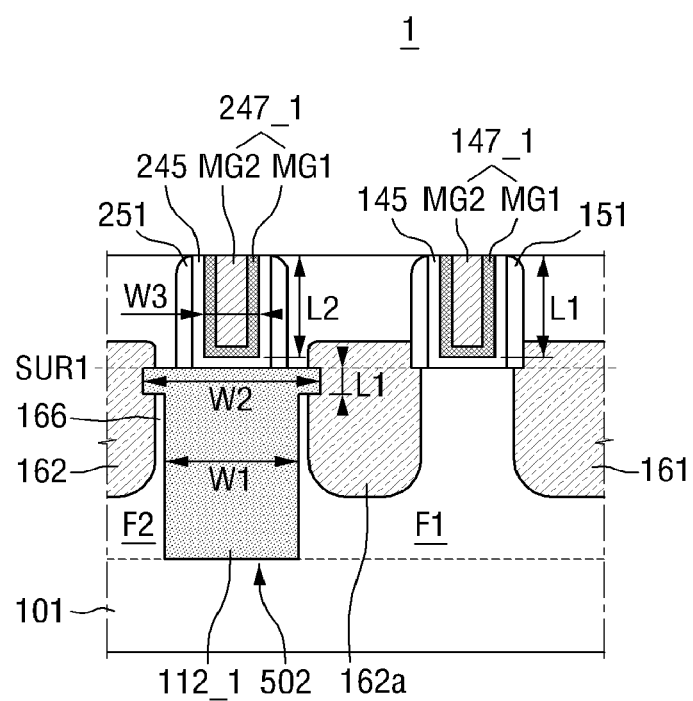
FIG. 6 is a cross-sectional view taken along the line B-B of FIG. 2A.
Figure 7:
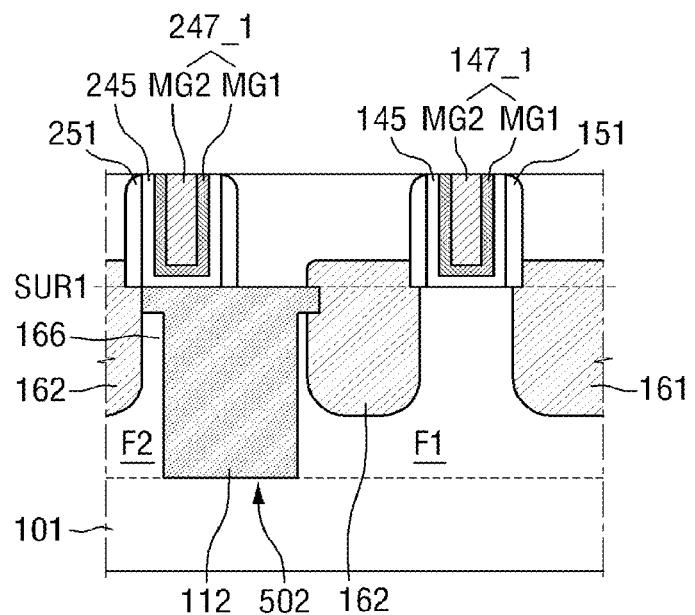
FIG. 7 illustrates a case where a dummy gate may be misaligned.

Hereinafter, a semiconductor device according to a first embodiment of the present invention will be described with reference to FIGS. 1A, 2A, 3, 4, 5A, 6 and 7. FIGS. 1A and 2A are a plan view and a perspective view of a semiconductor device according to a first embodiment of the present invention, FIG. 3 is a perspective view illustrating fins and a field insulation film of the semiconductor device shown in FIGS. 1A and 2A, FIG. 4 is a perspective view illustrating fins, a first trench and a second trench of the semiconductor device shown in FIGS. 1A and 2A, FIG. 5A is a cross-sectional view taken along the line A-A of FIG. 2A, FIG. 6 is a cross-sectional view taken along the line B-B of FIG. 2A; and FIG. 7 illustrates a case where a dummy gate is misaligned.

Referring first to FIGS. 1A, 2A, 3, 4, 5A and 6, the semiconductor device 1 according to the first embodiment of the present invention may include a plurality of fins F1 and F2, a plurality of gates 147_1, 147_2, 147_5 and 147_6, a field insulation film 110, a dummy gate 247_1, and a plurality of sources/drains 161 and 162.

The plurality of fins F1 and F2 may extend lengthwise in a second direction Y1. The fins F1 and F2 may be portions of substrate 101, such as being formed by etching a semiconductor wafer substrate (e.g., crystalline silicon). The Fins F1 and F2 may be an epitaxial layer selectively grown from the substrate 101 (e.g., formed by providing a patterned layer having openings exposing a semiconductor wafer substrate and epitaxially growing the fins F1 and F2 within the openings). In the illustrated embodiment, two fins F1 and F2 disposed in parallel to each other in a lengthwise direction are exemplified, but aspects of the present invention are not limited thereto.

In addition, in the illustrated embodiment, the fins F1 and F2 are rectangular parallelepiped, but aspects of the present invention are not limited thereto. For example, the fins F1 and F2 may be chamfered. For example, corner portions of the fins F1 and F2 may be rounded. In this example, fins F1 and F2 are formed to extend in the second direction Y1 and include long sides M1 and M2 extending along the second direction Y1 and short sides S1 and S2 extending along a first direction X1. In detail, the first fin F1 may have a first short side S1 and a first long side M1, and the second fin F2 may have a second short side S2 and a second long side M2. As shown, the fins F1 and F2 may be formed to their ends (in this example, short sides S1 and S2) face each other. Although corners of fins F1 and F2 are illustrated as right angles, it is expected that corners may include some degree of rounding. Also, while sides M1 and M2 are illustrated as perpendicular with respect to lower surface of substrate 101, sides M1 and M2 may slope (e.g., fins F1 and F2 may have a trapezoidal cross section with respect to a cross section taken in a direction perpendicular to second direction Y1). Sides S1 and S2 may also be sloped.

The fins F1 and F2 may define active patterns used to form a transistor. Transistors may be formed having a channel region formed along three surfaces of the fins F1 and F2. In addition, as shown in FIG. 4, the first trench 501 may have one side defined by the long sides M1 and M2 of the fins F1 and F2. The second trench 502 may have sides defined by short sides S1 and S2 of the fins F1 and F2. In detail, the second trench 502 may be interposed between the short side S1 of the first fin F1 and the short side S2 of the second fin F2 which face each other.

In this example, second trench 502 includes a first part trench 502a and a second part trench 502b connected to each other. The first part trench 502a may have a first width W1 and the second part trench 502b may have a second width W2 greater than the first width W1. The second part trench 502b may have sides defined by surfaces of the fins F1 and F2 and at recesses R1 and R2 inwardly formed in the fins F1 and F2 with respect to the respective sidewalls S1 and S2 of the fins F1 and F2.

As shown in FIG. 3, field insulation film 110 may be formed on the substrate 101 so as to surround portions of the plurality of fins F1 and F2.

In detail, the field insulation film 110 may include a first part 111 and a second part 112 having different heights. The first part 111 may be formed to extend lengthwise in the second direction Y1 and the second part 112 may be formed to extend lengthwise in the first direction X1. The field insulation film 110 may be an oxide film, a nitride film, an oxynitride film, or a combination thereof.

The first part 111 is formed within at least a portion of the first trench 501 and the second part 112 is formed within at least a portion of the second trench 502. The first part 111 may be formed to contact the long sides M1 and M2 of the fins F1 and F2 and the second part 112 may be formed to contact the short sides S1 and S2 of the fins F1 and F2.

The first part 111 may fill only a portion of the first trench 501. In addition, the second part 112 may completely fill the second trench 502. As the result, the first part 111 may have a height H0 and the second part 112 may have a height (H0+ H1).

Figure 28A:
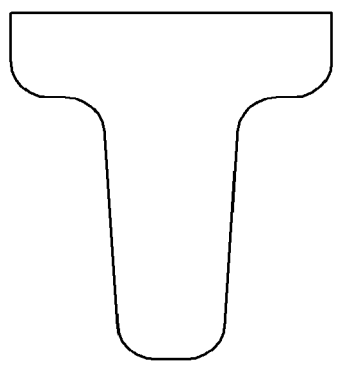
FIGS. 28A, 28B and 28C illustrate cross sectional shapes.
Figure 28B:
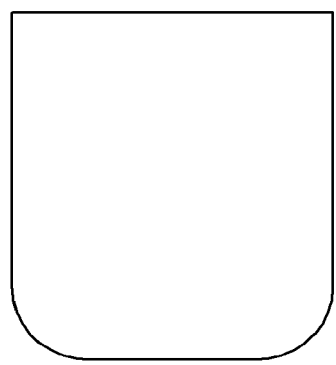
Figure 28C:
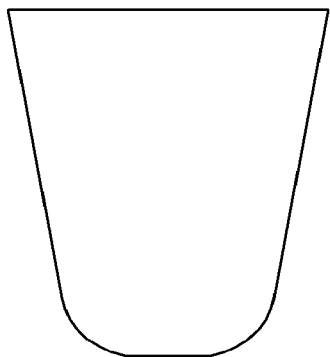

In detail, the second part 112 is disposed between the first fin F1 and the second fin F2 and is formed to fill the first trench part 502a and the second trench part 502b. As shown in FIG. 6, the second part 112 may include a first insulation film 112_1 filling the first trench part 502a and having a first width W1 and a second insulation film 112_2 filling the second trench part 502b and having a second width W2 greater than the first width W1. Therefore, the second part 112 may be formed to have a T-letter shape with respect to a cross section taken in a direction perpendicular to the first direction X1. By contrast, the first part 111 may be formed to have quadrilateral shape (with respect to a cross section taken in a direction perpendicular to the second direction Y1) such as a rectangular shape or a trapezoid. As noted herein, such shapes may not be precise due to standard manufacturing processes. FIGS. 28A, 28B and 28C illustrate examples of a T-shaped cross section (FIG. 28A), a rectangular cross section (FIG. 28B) and a trapezoidal cross section (FIG. 28C) including rounded corners and other deviations that might result from typical manufacturing process.

As described above, the second part 112 may be formed to extend lengthwise in the first direction X1. Here, as shown in FIG. 3, a region of the second part 112 outside trench 502 the fins F1 and F2 a fourth width W4. The first insulation film 112_1 having the first width W1 and the second insulation film 112_2 having the second width W2 may be disposed in regions overlapping with the fins F1 and F2. As shown in FIG. 3, the fourth width W4 may be equal to the second width W2. As will later be described, the fourth width W4 and the second width W2 may be equal to each other when a trench 993 is formed using a mask having a line type opening 991 (see FIG. 18, e.g.).

The second part 112 may be formed under the dummy gate 247_1 and the first part 111 may be formed under the gates 147_1, 147_2, 147_5 and 147_6.

The plurality of gates 147_1, 147_2, 147_5 and 147_6 may be formed on the corresponding fins F1 and F2 so as to cross the corresponding fins F1 and F2. For example, first and second gates 147_1 and 147_2 may be formed on the first fin F1 and fifth and sixth gates 147_5 and 147_6 may be formed on the second fin F2. The gates 147_1, 147_2, 147_5 and 147_6 may extend lengthwise in the first direction X1. The gates 147_1 and 147_2 may extend along opposite sidewall of fin F1 (side M1 and the side of fin F1 opposite side M1) and over the top surface of fin F1. The gates 147_5 and 147_6 may extend along opposite sidewalls of fin F2 (side M2 and the side of fin F2 opposite side M2) and extend over the top surface of fin F2. Channel regions may be formed from the fins at locations on the sidewalls and top surfaces where corresponding gates have been formed.

The dummy gate 247_1 may be formed on the second part 112. In this example, only one the dummy gate 247_1 is formed on the second part 112. Since only one of the dummy gates 247_1 is formed, rather than two or more of the dummy gates 247_1 being formed, the layout size can be reduced. In addition, a width W3 of the dummy gate 247_1 may be smaller than the width W1 of the second part 112. In such a manner, the dummy gate 247_1 can be more accurately disposed on the second part 112. Although only one dummy gate 247_1 is formed on the second part 112 in this example, plural dummy gates 247_1 may be formed on the second part 112.

Referring to FIGS. 5 and 6, each gate (here, showing only gates 147_1 and 247_1) may include metal layers MG1 and MG2. As shown, the gate 147_1 may include two or more metal layers MG1 and MG2 stacked one on the other. The first metal layer MG1 may function to adjust a work function, and the second metal layer MG2 may function to fill a space defined by the first metal layer MG1. For example, the first metal layer MG1 may include at least one of TiN, TaN, TiC, and TaC. In addition, the second metal layer MG2 may include W or Al. Alternatively, the gate 147_1 may be formed by, for example, a replacement process, but aspects of the present invention are not limited thereto.

Each dummy gate (e.g., 247_1) may have a structure similar to that of the gate 147_1. As shown, the dummy gate 247_1 may include two or more metal layers MG1 and MG2 stacked one on the other. For example, the first metal layer MG1 may function to adjust a work function, and the second metal layer MG2 may function to fill a space defined by the first metal layer MG1.

Gate insulation film 145 may be formed between the first fin F1 and the gate 147_1. As shown in FIG. 5A, the gate insulation film 145 may be formed on a top surface of and upper portions of sidewall surfaces of the first fin F1. In addition, the gate insulation film 145 may be formed between the gate 147_1 and the first part 11. The gate insulation film 145 may include a high-k dielectric material having a higher dielectric constant than a silicon oxide film. For example, the gate electrode insulation film 145 may include $HfO_2$, $ZrO_2$, LaO, $Al_2O_3$ or $Ta_2O_5$. The high-k dielectric preferably may have a dielectric constant of 6 or greater. Alternatively, the high-k dielectric may have a dielectric constant of 8 or greater, larger than 10.

A plurality of source/drains 161 and 162 may be disposed between the plurality of gates 147_1, 147_2, 147_5 and 147_6 and between the gates 147_1, 147_5 and the dummy gate (e.g., 247_1).

The source/drains 161/162 may be formed as part of fins F1 and F2. The source/drains 161 and 162 may be elevated source/drains formed to protrude further than the fins F1 and F2. The elevated source/drains may be epitaxial, and formed by a selective epitaxial growth of a semiconductor, such as SiGe. The epitaxial source/drains 161/162 may be a crystalline material that has a lattice mismatch with the semiconductor fin crystalline material of fins F1 and F2 to induce a compressive or tensile strain in the neighboring channel region formed under the corresponding gate 147_1, 147_2, 147_5 and 147_6.

In addition, side portions of the source/drains 161 and 162 may be formed against (and contact) spacer 151. Also portions of the source/drains 161 and 162 adjacent the dummy gate 247_1 may overlap with the second insulation film 112_2. In the example shown in FIG. 6, the source/drains 161 and 162 adjacent the dummy gate 247_1 may be formed under, on the side and on top of edge portions of insulation film 112_2. Portions of the source/drains 161 and 162 may be shaped to be tucked under lower portions of the spacer 151.

Heights of the source/drains 161/162 disposed between the plurality of gates 147_1, 147_2, 147_5 and 147_6 and heights of the sources/drains 162 disposed between each of the gates 147_1, 147_5 and the dummy gate 247_1 may be equal to each other. In this disclosure, when expressing heights being equal (or other dimension), deviations due to standard manufacturing deviations or other process error is contemplated.

When the semiconductor device 1 according to the first embodiment of the present invention is a PMOS transistor, the sources/drains 161 and 162 may include a compressive stress material. For example, the compressive stress material may be a material having a larger lattice constant than silicon (Si), for example, SiGe. The compressive stress material may improve the mobility of carriers of a channel region by applying compressive stress to the first fin F1.

Alternatively, when the semiconductor device 1 according to the first embodiment of the present invention is an NMOS transistor, the sources/drains 161 and 162 may include the same material as the substrate 101 or a tensile stress material. For example, when the substrate 101 includes Si, the sources/drains 161 and 162 may include Si or a material having a smaller lattice constant than Si (e.g., SiC).

Unlike in the illustrated embodiment, the sources/drains 161 and 162 may be formed by doping impurity into the fins F1 and F2. In this alternative embodiment, no etching of the fins F1 and F2 for source drain epitaxial grown is needed. The height of the source/drains 161 and 162 would the same as the height of the remainder of fins F1 and F2.

Spacers 151 and 251 may include at least one of a nitride film and an oxynitride film. The spacers 151 and 251 may be formed on sidewalls of the plurality of gates 147_1, 147_2, 147_5 and 147_6, and the dummy gate 247_1.

The substrate 101 may be made of one or more semiconductor materials selected from the group consisting of, for example, Si, Ge, SiGe, GaP, GaAs, SiC, SiGeC, InAs and InP. The substrate may monolithic crystalline semiconductor. Alternatively, the substrate 101 may be a silicon on insulator (SOI) substrate or formed of other semiconductor materials (such as those previously mentioned) on insulator. As noted, fins F1 and F2 may be formed integrally with the substrate by etching the substrate 101 (e.g., etching trenches like trenches 501 and 502). Alternatively, the fins may be formed by selective epitaxial growth of the fins from a surface of the substrate 101. In either alternative, the fins F1 and F2 are provided with substrate 101. For purposes of this description, to assist in identification of elements, raised source/drains (source/drain regions selectively epitaxially grown above the surface of an original fin) are not considered a portion of the fins F1 and F2. Thus, in this instance, referring to a top surface of the fin would not refer to a top surface of the raised source/drain. Note, however, that source/drains may be part of fins F1 and F2, such as when the original fin is doped (e.g., via ion implantation) to form source/drains (even if the original fins were epitaxially grown from a surface of substrate 101 or subject to other epitaxial growth in their formation). In this instance, reference to a top surface of the fin may refer to a top surface of a source/drain.

Meanwhile, as shown in FIG. 6, a top surface of the second part 112 (here, the top surface of the second part 112 is a top surface of the second insulation film 112_2) and top surfaces of the fins F1 and F2 may have the same height to form a single continuous (e.g., planar) surface SUR1 (which may encompass slight deviations due to standard manufacturing process errors). Accordingly, a height L1 of the gate (e.g., 147_1) formed on the fin (e.g., F1) and a height L2 of the dummy gate 247_1 formed on the second part 112 may be equal to each other. That is to say, the plurality of gates 147_1, 147_2, 147_5 and 147_6 may have a considerably reduced variation in the height L1. As described above, the gates 147_1, 147_2, 147_5 and 147_6 may be made of a metal, and the gates 147_1, 147_2, 147_5 and 147_6 may have varying heights, thereby demonstrating different operating characteristics. Therefore, if the plurality of gates 147_1, 147_2, 147_5 and 147_6 have small variations in height, operating characteristics may be better controlled.

As will later be described, in order to make the top surface of the second part 112 (e.g., the top surface of the second insulation film 112_2) the same height as the top surfaces of the fins F1 and F2, the following steps may be used: forming a separate mask/forming trenches (see, e.g., FIGS. 18 and 19), filling the trenches (see, e.g., FIGS. 20 and 21) and a field recess process (see, e.g., FIGS. 24 and 25).

The second width W2 of the second insulation film 112_2 is greater than the first width W1 of the first insulation film 112_1. The second width W2 of the second insulation film 112_2 is sufficiently greater than the third width W3 of the dummy gate 247_1. Therefore, the dummy gate 247_1 can be stably disposed on the second insulation film 112_2. As shown in FIG. 7, even if the dummy gate 247_1 is misaligned, it is highly probable for the dummy gate 247_1 to be disposed on the second insulation film 112_2. It should be noted that positioning of dummy gates, such as 247_1, fully or partially on the fin (e.g., fin F2) is within the scope of this invention.

The second insulation film 112_2 may have a thickness t1 in a range of between 0.01 Å and 300 Å. As will later be described, the thickness t1 may vary according to a field recess process, such as that shown in FIGS. 24 and 25.

In addition, as shown in FIG. 6, the first insulation film 112_1 and the elevated source/drain 162 may not contact each other; portions 166 of the fins F1 and F2 may be positioned between the first insulation film 112_1 and the elevated source/drains 162. However, aspects of the present invention are not limited thereto.

Figure 1B:
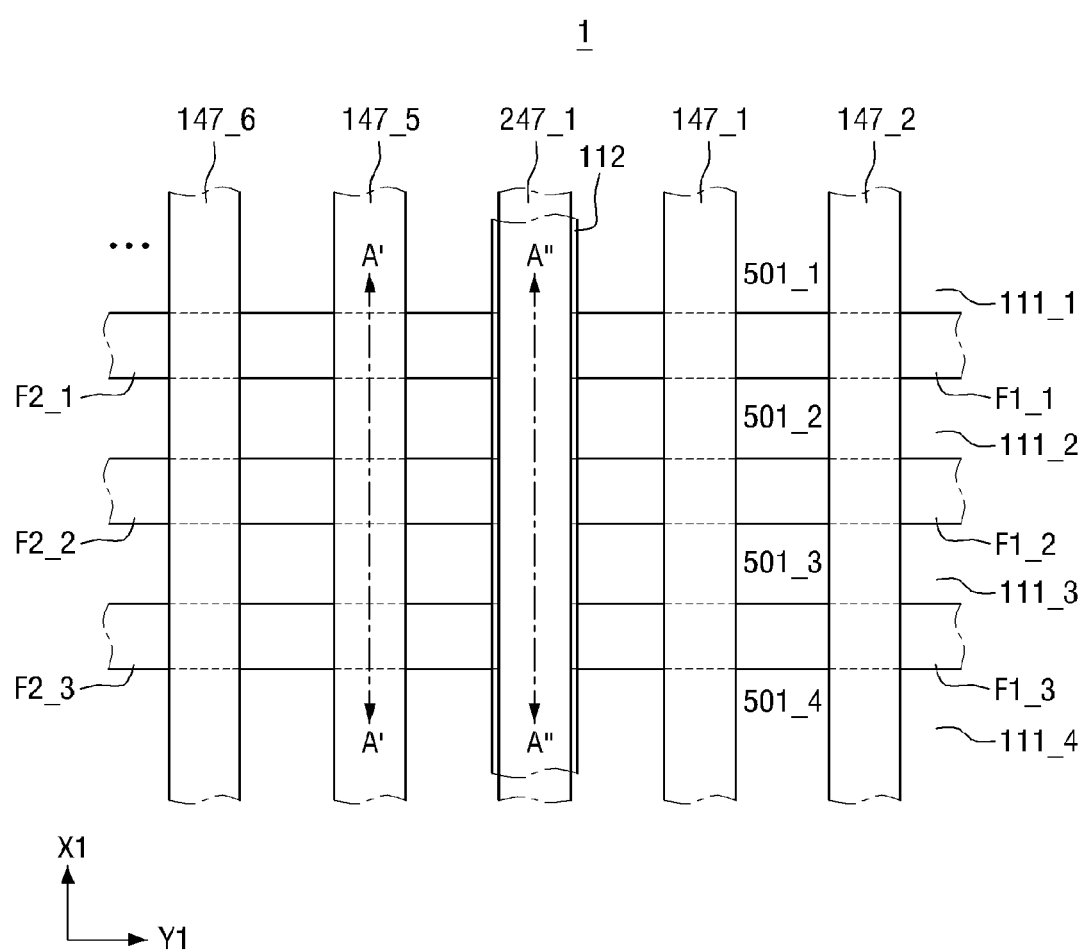

FIG. 1A illustrates a top down view of a semiconductor device showing further details when the first embodiment described above with respect to FIGS. 1A, 2A, 3, 4, 5A, 6 and 7 includes multiple fins arranged side by side. FIG. 1B illustrates three fin pairs F1_n and F2_n (n=1 to 3), with each fin pair F1_n/F2_n arranged to have their ends face each other (under dummy gate 247_1). Each of the fin pairs F1_n and F2_n and surrounding structure may constitute the structure and be formed as described with respect to fins F1 and F2 with respect to FIGS. 1A, 2A, 3, 4, 5A, 6 and 7, and thus repetitive description may be omitted here. As illustrated in FIG. 1B, plural trenches 501_1 to 501_4 are formed between adjacent fins. The trenches 501_1 to 501_4 are formed with respective first parts 111_1 to 111_4 of field insulation film 110 as described above.

Gates 147_1, 147_2, 147_5 and 147_6 extend in the first direction X1 across plural fins and into trenches 501_1 to 501_4 over the first parts 111_1 to 111_4 of field insulation film 110. Second part 112 of field insulation film 110 extends in the first direction X1 over the first parts 111_1 to 111_4 of field insulation film 110 and between facing ends of fin pairs F1_n and F2_n. Dummy gate 247_1 extends in the first direction X1 over second part 112.

Figure 5B:
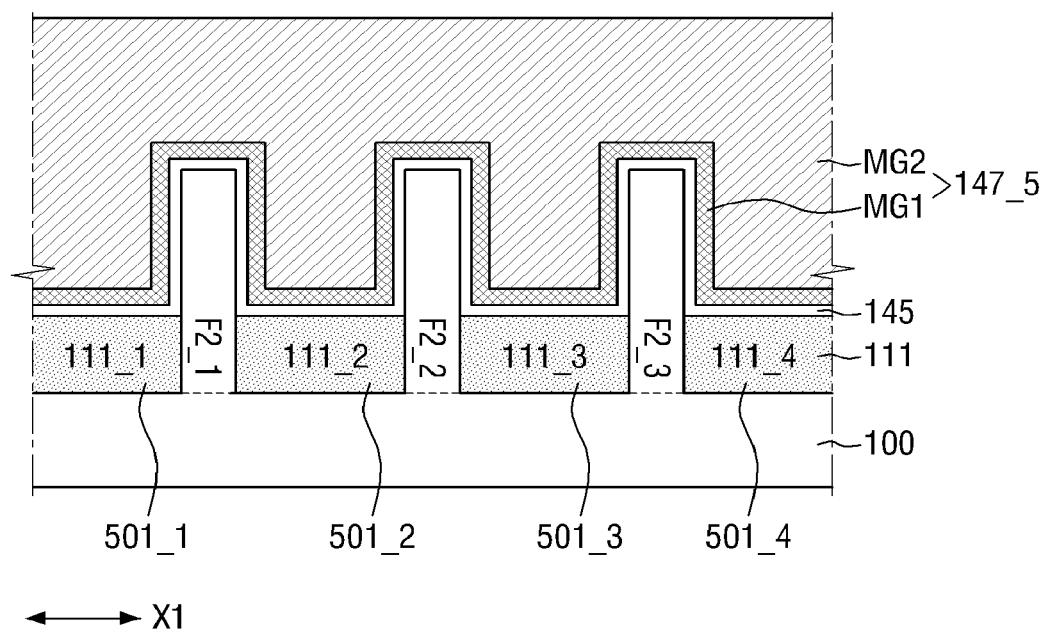
FIG. 5B is a cross section taken along line A'-A' of FIG. 1B.

FIG. 5B illustrates a cross-sectional view of gate 147_5 taken along line A'-A' in FIG. 1B. Trenches 501_1 to 501_4 are formed between fins, such as trench 501_2 between fin F2_1 and fin F2_2 and trench 501_3 between fin F2_2 and F2_3. Trenches 501_n may be defined by sidewalls of the fins and a surface of substrate 101. Trenches 501_1 to 501_4 are partially filled with first parts 111_1 to 111_4 of field insulation film 110. As shown in FIG. 5B, gate 147_5 and corresponding gate electrode insulation film 145 extend along sidewalls and top surfaces of fins F2_1, F2_2 and F2_3 and across first parts 111_1 to 111_4 of field insulation film 110. The lower surface of gate 147_5 thus undulates about the fins F2_1, F2_2 and F2_3 to create a three dimensional channel region (having an upside down U-shaped cross section about each of the fins in FIG. 5B).

Figure 5C:
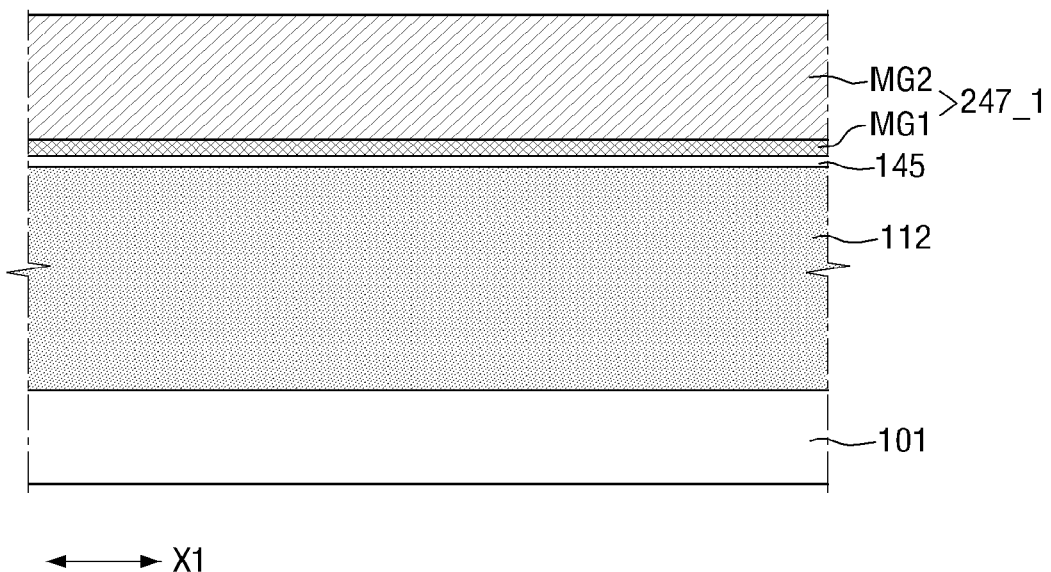
FIG. 5C is a cross section taken along line A"-A" of FIG. 1C.

FIG. 5C illustrates a cross-sectional view of dummy gate 247_1 taken along line A"-A" in FIG. 1B. As shown in FIG. 5C, second part 112 of field insulation film 110 is formed on substrate 101. Dummy gate 247_1 extends over the second part 112 of the field insulation film 110 with gate electrode insulating film 145 interposed therebetween. The lower surface of dummy gate 247_1 is substantially flat in this example. The height of the lower surface of dummy gate 247_1 is higher than the lower surface of gates 147_n (such as 147_5 shown in FIG. 2B). In this example, the difference in the height of the lower surfaces of the dummy gate 247_1 and gates 147_n is equal to the difference in heights of the second part 112 of the field insulation film 110 and the first part 111 of the field insulation film 110. This difference in height of the lower surfaces of the dummy gate 247_1 and gates 147_n may be equal to the amount the fins extend above the upper surface of the first part 111 of the field insulation (when the top surfaces of the fins F1_n/F2_n are the same height as the top surface of the second part 112). Alternatively, this difference in height of the lower surfaces of the dummy gate 247_1 and gates 147_n may be less than or greater than the amount the fins extend above the upper surface of the first part 111 of the field insulation (when the top surface of the second part 112 is the respectively lower than or higher than the top surfaces of the fins F1_n/F2_n). It should be emphasized that while the disclosure describe and illustrate first part 111 and second part 112 as separate portions, they may be formed in the same process step and be homogeneously and integrally formed in part or in whole (e.g., parts of or all of 111 and 112 may be homogeneous and integrally formed of the same material). Similarly, both of the first part 111 and the second part 112 or the combination of the first part 111 and the second part 112 of the same may be formed of multiple layers in multiple process steps.

Figure 2B:
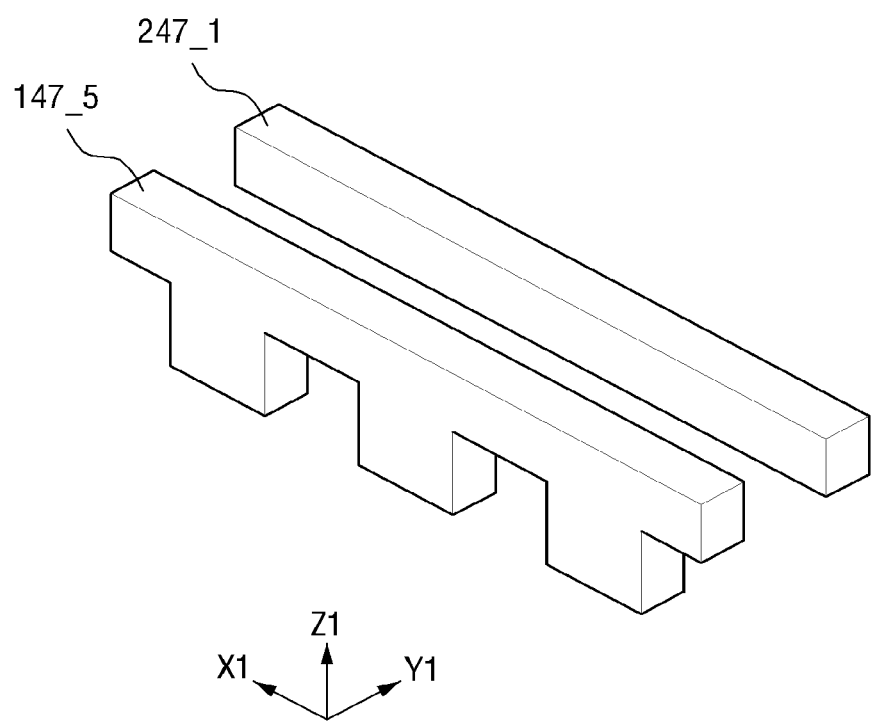

Thus, as illustrated in FIGS. 5B and 5C, lower surfaces of gate electrodes 147_n may undulate about the fins F1_n/F2_n while the lower surface of dummy gate electrode 247_1 is relatively flat. Further, lowermost portions of gate electrodes 147_n are at a lower height than lowermost portions of dummy gate electrode 247_1. FIG. 2B illustrates this difference, showing a perspective view of gate electrode 147_5 and dummy gate 247_1 (with fins and other structure not show for purposes of illustration).

Figure 8:
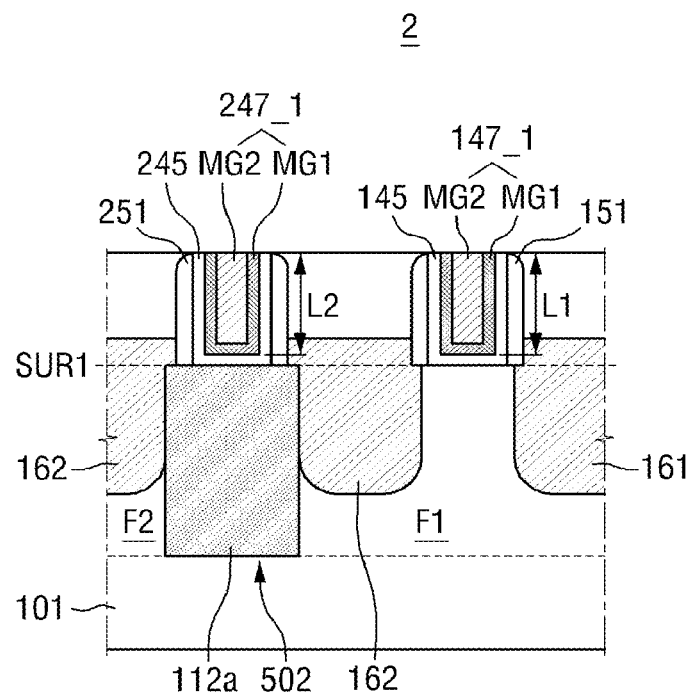
FIG. 8 is a cross-sectional view of a semiconductor device according to a second embodiment of the present invention.

FIG. 8 is a cross-sectional view of a semiconductor device according to a second embodiment of the present invention. For the sake of convenient explanation, shared features as those described with reference to FIGS. 1 to 7 will be omitted.

Referring to FIG. 8, in the semiconductor device 2 according to the second embodiment of the present invention, a second part 112 may have a cross section having a quadrilateral shape, instead of a T-letter shape, such as a rectangular or trapezoidal shape.

A top surface of the second part 112 may be at the same height as top surfaces of the fins F1 and F2 and combine to form a substantially planar surface SUR1. A height L1 of a gate (e.g., 147_1) formed on a fin (e.g., F1) and a height L2 of a dummy gate 247_1 formed on the second part 112 may be equal to each other in the cross section of FIG. 8. As will later be described, in order to make the top surface of the second part 112 (e.g., the top surface of the second insulation film 112_2) flush with the top surfaces of the fins F1 and F2, the following steps may be used: forming a separate mask/forming trenches (see FIGS. 18 and 19), filling the trenches (see FIGS. 20 and 21) and a field recess process (see FIGS. 24 and 25). According to how much the field recess process is progressed, the second part 112 may have a T-letter shape or a quadrilateral shape (see FIGS. 24 to 26). For example, if the field recess process progresses long enough, the second part 112 may be formed in quadrilateral (e.g., rectangular or trapezoidal) shape. Other methods may be used to obtain the quadrilateral shape of the second part 112. For example, after forming fins, field insulation film may be deposited in trenches 501 and 502, followed by a planarization step to expose top surfaces of the fins. The second part 112 may then be protected by placing a patterned hard mask thereon, and an etch-back of the field insulation film 110 in trenches may be 501 performed to obtain the first part 111 of the field insulation film 110.

Figure 9:
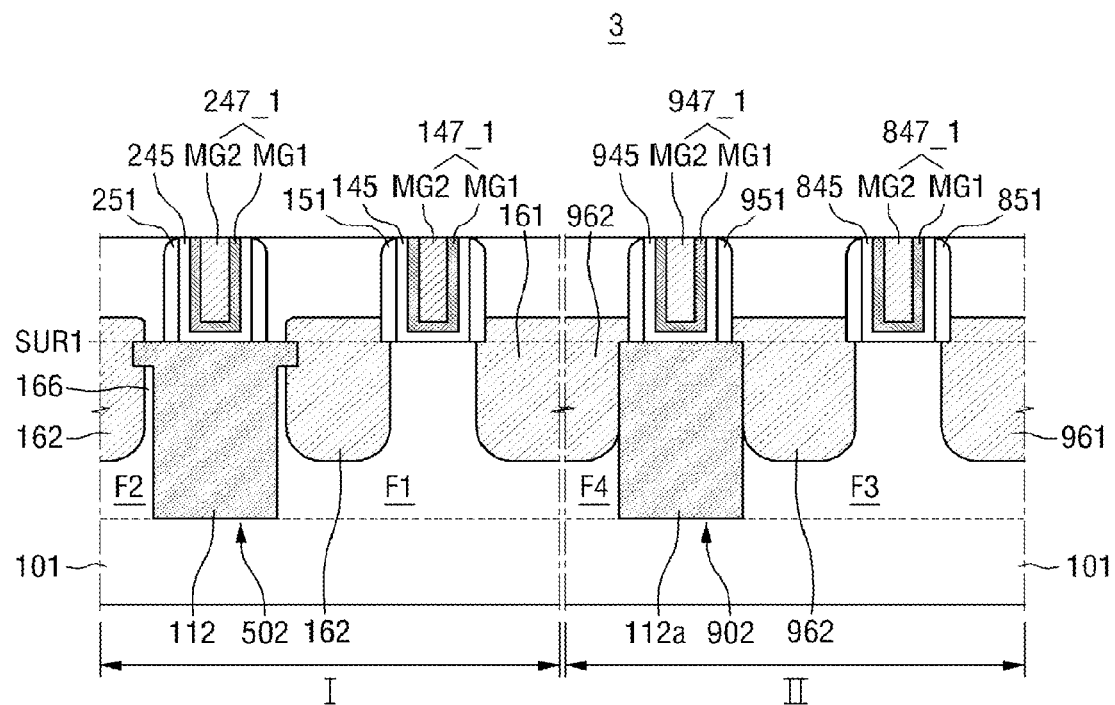
FIG. 9 is a cross-sectional view of a semiconductor device according to a third embodiment of the present invention.

FIG. 9 is a cross-sectional view of a semiconductor device according to a third embodiment of the present invention. For the sake of convenient explanation, shared features as those described with reference to FIGS. 1 to 8 will be omitted.

Referring to FIG. 9, in the semiconductor device 3 according to the third embodiment of the present invention, a first region I and a second region II are defined in a substrate 101. A first fin F1 and a second fin F2, which are aligned end-to-end and parallel to each other, and a T-shaped field insulation film 112 formed between the first fin F1 and a second fin F2, are formed in the first region I. A third fin F3 and a fourth fin F4, which are aligned end-to end and parallel to each other, and an quadrilateral (e.g., rectangular or trapezoidal) field insulation film 112a, are formed in the second region II.

A top surface of the T-shaped field insulation film 112 may have the same height as a top surface of the first fin F1 and form part of planar surface SUR1. A top surface of the quadrilateral shaped field insulation film 112a may have the same height as a top surface of a third fin F3 and form part of planar surface SUR1. In addition, the top surface of the T-shaped field insulation film 112 and the top surface of the 1-shaped field insulation film 112a may have the same height and form part of surface SUR1. A height of a dummy gate 247_1 formed on the field insulation film 112 and a height of a dummy gate 947_1 formed on the field insulation film 112a may be equal to each other in the cross section of FIG. 9.

Here, the T-shaped field insulation film 112 and the quadrilateral-shaped field insulation film 112a may be positioned in the same logic region (that is, the first region I and the second region II may be the same logic region). Alternatively, the T-shaped field insulation film 112 and the quadrilateral-shaped field insulation film 112a may be positioned in a memory cell region, such as an SRAM region. The field insulation films 112 and 112a having different shapes may be simultaneously formed. The field insulation films 112 and 112a may be simultaneously formed in the same region because the T-shaped field insulation film 112 may be formed and the quadrilateral-shaped field insulation film 112a may be formed by process variations in the steps of forming a separate mask/forming trenches (see FIGS. 18 and 19), filling the trenches (see FIGS. 20 and 21) and the field recess process (see FIGS. 24 and 25).

Alternatively, one of the field insulation film 112 and the field insulation film 112a may be positioned in a logic region and the other of the field insulation film 112 and the field insulation film 112a may be positioned in a memory region, such as an SRAM region.

Reference numeral 902 denotes a trench in which the field insulation film 112a is formed, reference numerals 961 and 962 denote elevated source/drain, and reference numeral 847_1 denotes a gate.

Figure 10:
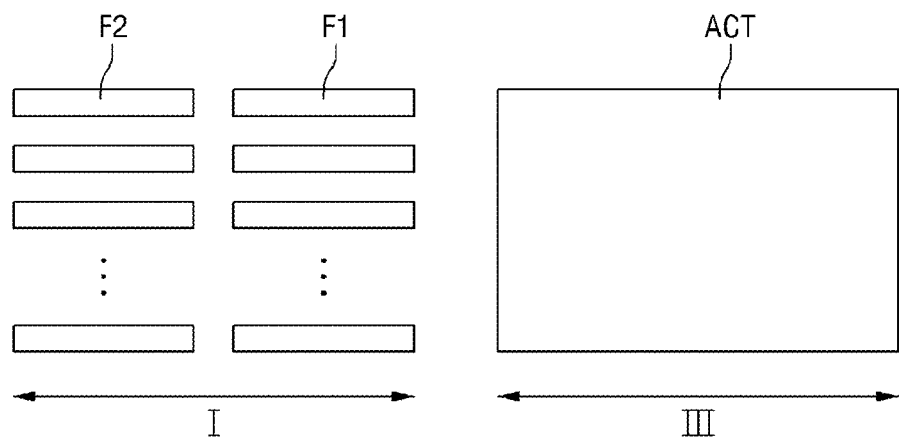
FIGS. 10 and 11 illustrate a semiconductor device according to a fourth embodiment of the present invention.
Figure 11:
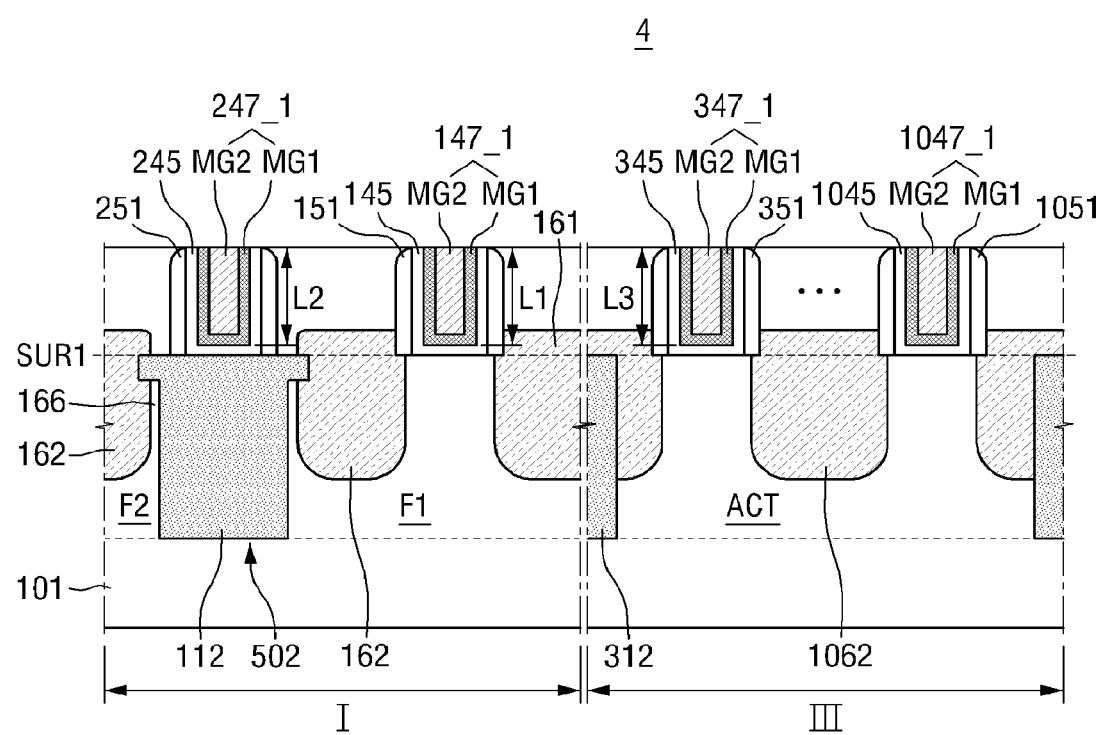

FIGS. 10 and 11 illustrate a semiconductor device according to a fourth embodiment of the present invention. For the sake of convenient explanation, shared features as those described with reference to FIGS. 1 to 8 will be omitted.

Referring to FIG. 10, a first region I and a third region III are defined in a substrate 101. A plurality of fins F1 and F2 may be formed in the first region I, and the second region II may be a planar active region. The planar active region ACT may be wider than the area bounding the plurality of fins F1 and F2.

A fin type transistor is formed in the first region I. The fin type transistor may include a first fin F1, a gate 147_1 formed on the first fin F1, and source/drain 162 disposed in the first fin F1 at opposite sides of the gate 147_1. In addition, the fin type transistor may include a T-shaped second part 112 disposed between the first fin F1 and the second fin F2 adjacent to each other, and a dummy gate 247_1 formed on the second part 112.

A planar transistor may be formed in the second region II. The planar transistor may include an active region ACT, gates 347_1 and 1047_1 formed on the active region ACT and source/drain 1062 disposed in the active region ACT at opposite sides of the gates 347_1 and 1047_1. The active region ACT may be defined in substrate 101 and comprise a planar surface of the substrate 101.

Here, a top surface of the first fin F1 may have the same height as a top surface of the active region ACT. Both the top surface of the first fin F1 and the top surface of the active region ACT may be portions of the surface of substrate 101. Accordingly, a height L1 of the gate 147_1 and a height L3 of a gate 347_1 or 1047_1 may be equal to each other.

In addition, a top surface of a T-shaped second part 112 may have the same height as the top surface of the first fin F1 and form elements of surface SUR1. Accordingly, a height L2 of the dummy gate 247_1 formed on the T-shaped second part 112 and the height L1 of the gate 147_1 may be equal to each other. Consequently, the heights of all of the gates 147_1, 247_1, 347_1 and 1047_1 may be equal to each other.

Figure 12:
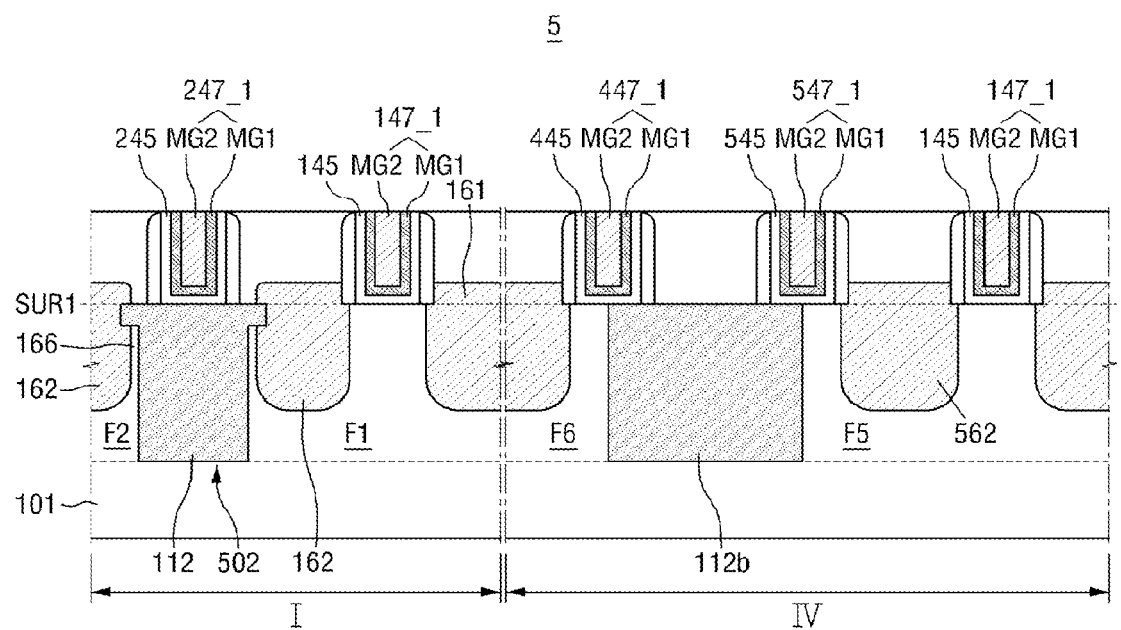
FIG. 12 is a cross-sectional view of a semiconductor device according to a fifth embodiment of the present invention.

FIG. 12 is a cross-sectional view of a semiconductor device according to a fifth embodiment of the present invention. For the sake of convenient explanation, shared features as those described with reference to FIGS. 1 to 8 will be omitted.

Referring to FIG. 12, in the semiconductor device 5 according to the fifth embodiment of the present invention, a first region I and a fourth region IV are defined in a substrate 101. In the first region I, a field insulation film 112 with a single dummy gate 247_1 formed thereon is disposed between a first fin F1 and a second fin F2. In a second region II, a field insulation film 112b having two dummy gates 447_1 and 547_1 disposed thereon is disposed between a fifth fin F5 and a sixth fin F6. The device in the fourth region may otherwise be the same one of the semiconductor devices 1 and 2 as described previously.

In detail, one of the semiconductor devices 1 and 2 according to the first and second embodiments may be formed in the first region I. For example, as shown, in the first region I, the first fin F1 and the second fin F2, which are aligned end to end and parallel to each other, and a T-shaped field insulation film 112 formed between the first fin F and the second fin F2, may be formed.

In the fourth region IV, the field insulation film 112b is formed between the fifth fin F5 and the sixth fin F6, a dummy gate 447_1 is formed on the sixth fin F6 and the field insulation film 112b, and a dummy gate 547_1 is formed on the fifth fin F5 and the field insulation film 112b. The dummy gate 447_1 may be formed over a boundary of the sixth fin F6 and field insulation film 112b. The dummy gate 547_1 may be formed over a boundary of the fifth fin F5 and the field insulation film 112b. Elevated source/drain 562 may be disposed between the dummy gate 447_1 or 547_1 and a gate 147_1 adjacent thereto.

Here, a top surface of the field insulation film 112b may have the same height as a top surface of the T-shaped field insulation film 112, both of which may form parts of planar surface SUR1. A top surface of the field insulation film 112 may have the same height as a top surface of the first fin F1, both of which may form parts of planar surface SUR1. A top surface of the field insulation film 112b may have the same height as a top surface of the fifth fin F5, both of which may form parts of planar surface SUR1. Heights of the dummy gates 247_1, 447_1 and 547_1 formed on the field insulation films 112 and 112b and a height of the gate 147_1 may be equal to each other in the cross section of FIG. 12.

Figure 13:
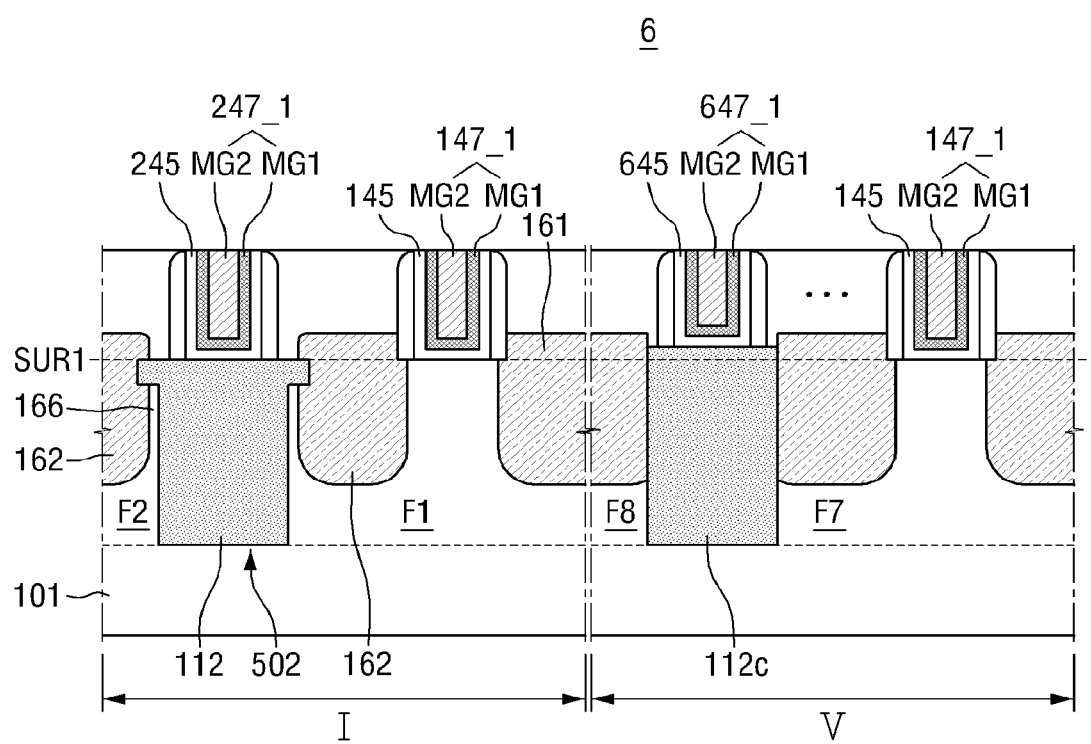
FIG. 13 is a cross-sectional view of a semiconductor device according to a sixth embodiment of the present invention.

FIG. 13 is a cross-sectional view of a semiconductor device according to a sixth embodiment of the present invention. For the sake of convenient explanation, shared features as those described with reference to FIGS. 1 to 8 will be omitted.

Referring to FIG. 13, in the semiconductor device 6 according to the sixth embodiment of the present invention, one of the semiconductor devices 1 and 2 according to the previous embodiments may be formed in a first region I. In a fifth region V, a field insulation film 112c may be disposed between a seventh fin F7 and an eighth fin F8. A top surface of the field insulation film 112c may be higher than a top surface of the seventh fin F7 adjacent to the field insulation film 112c. Accordingly, a height of a dummy gate 647_1 formed on the field insulation film 112c may be smaller than a height of a gate 147_1 formed on the seventh fin F7 and may be smaller than a height of dummy gate 247_1 on second part 112 of isolation film. The device described in the fifth region V may otherwise be the same as one of the semiconductor devices 1 and 2 as previously described.

Figure 14:
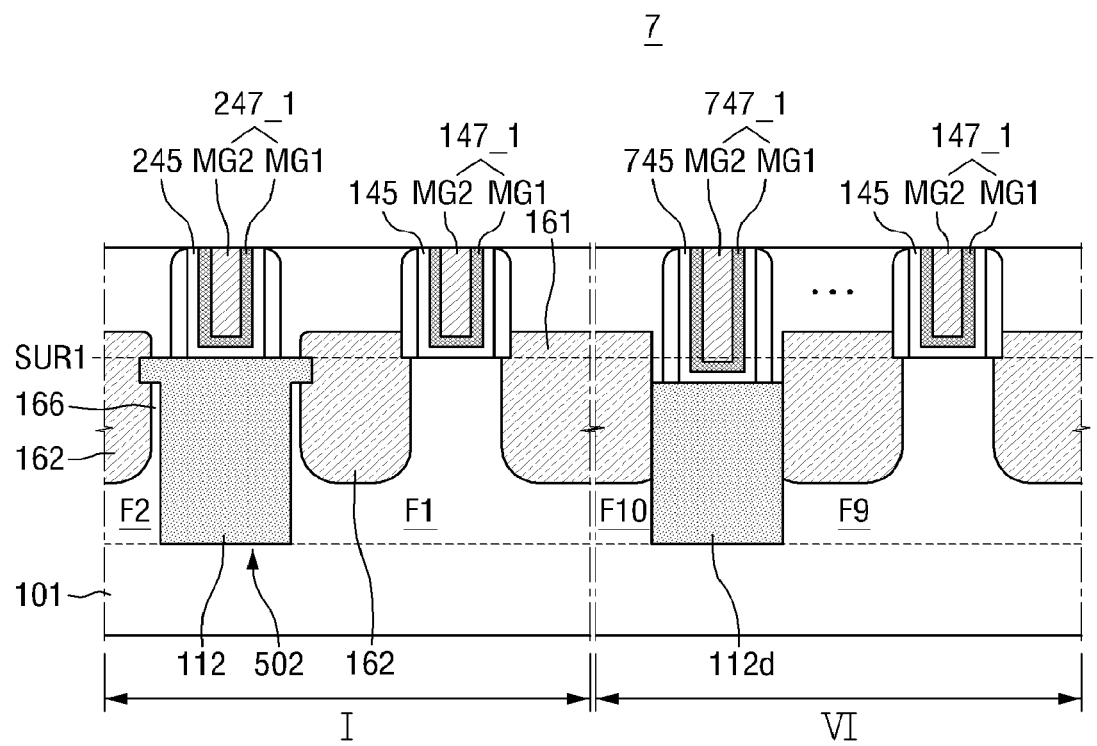
FIG. 14 is a cross-sectional view of a semiconductor device according to a seventh embodiment of the present invention.

FIG. 14 is a cross-sectional view of a semiconductor device according to a seventh embodiment of the present invention. For the sake of convenient explanation, shared features as those described with reference to FIGS. 1 to 8 will be omitted.

Referring to FIG. 14, in the semiconductor device 7 according to the seventh embodiment of the present invention, one of the semiconductor devices 1 and 2 according to the previous embodiments may be formed in a first region I. In a sixth region VI, a field insulation film 112d may be disposed between a ninth fin F9 and a tenth fin F10. A top surface of the field insulation film 112d may be lower than a top surface of the ninth fin F9 adjacent to the field insulation film 112d. Accordingly, a height of a dummy gate 747_1 formed on the field insulation film 112d may be greater than a height of a gate 147_1 formed on the ninth fin F9 and greater than a height of dummy gate 247_1. The device formed in the sixth region VI may otherwise be the same as one of the semiconductor devices 1 and 2 described previously.

Figure 15:
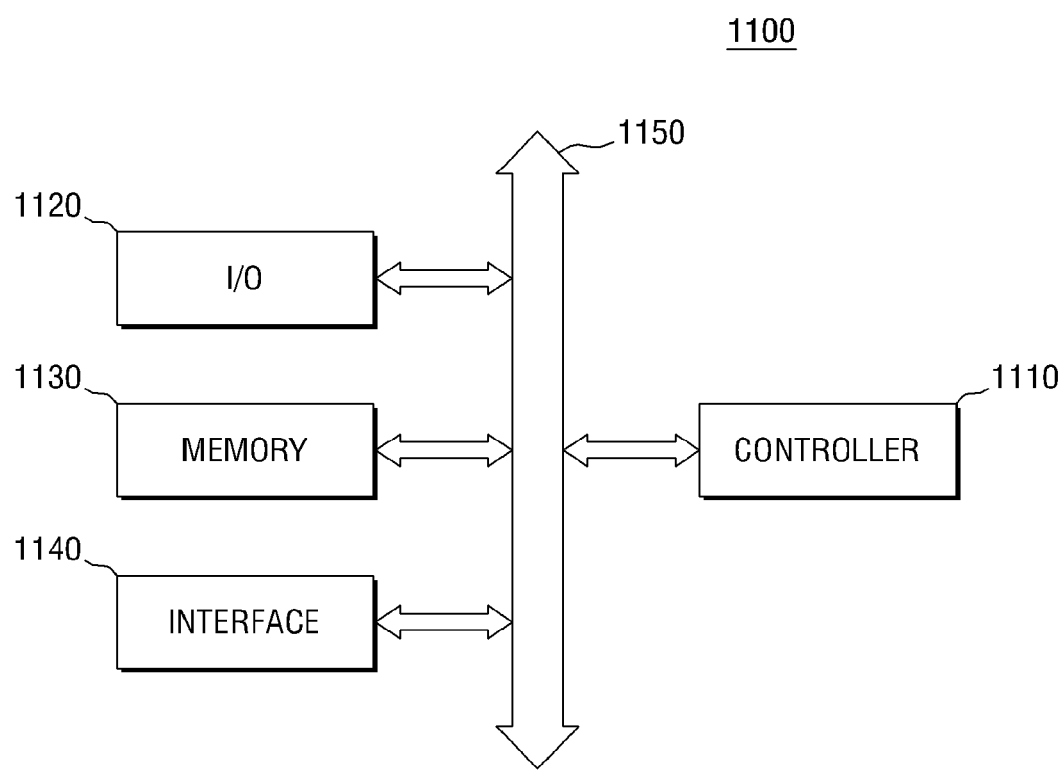
FIG. 15 is a block diagram of an electronic system including a semiconductor device according to some embodiments of the present invention.

FIG. 15 is a block diagram of an electronic system according to some embodiments of the present invention.

The electronic system shown in FIG. 15 is an exemplary system which may include the semiconductor devices shown in FIGS. 1 to 14.

Referring to FIG. 15, the electronic system 1100 may include a controller 1110, an input/output device (I/O) 1120, a memory 1130, an interface 1140 and a bus 1150. The controller 1110, the I/O 1120, the memory 1130, and/or the interface 1140 may be connected to each other through the bus 1150. The bus 1150 corresponds to a path through which data moves.

The controller 1110 may include at least one of a microprocessor, a digital signal processor, a microcontroller, and logic elements capable of functions similar to those of these elements. The I/O 1120 may include a keypad, a keyboard, a display device, and so on. The memory 1130 may store data and/or commands. The interface 1140 may perform functions of transmitting data to a communication network or receiving data from the communication network. The interface 1140 may be wired or wireless. For example, the interface 1140 may include an antenna or a wired/wireless transceiver, and so on. Although not shown, the electronic system 1100 may further include high-speed DRAM and/or SRAM as the operating memory for improving the operation of the controller 1110. Fin electric field effect transistors according to some embodiments of the present invention may be provided in the memory 1130 or may be provided some components of the controller 1110 or the I/O 1120.

The electronic system 1100 may be applied to a personal digital assistant (PDA), a portable computer, a web tablet, a wireless phone, a mobile phone, a digital music player, a memory card, or any type of electronic device capable of transmitting and/or receiving information in a wireless environment.

Hereinafter, a fabricating method of a semiconductor device according to a first embodiment of the present invention will be described with reference to FIGS. 16 to 25 and FIGS. 1 to 6. FIGS. 16 to 25 illustrate intermediate process steps of a fabricating method of a semiconductor device according to the first embodiment of the present invention as well as those embodiments including the first device 1 of the first embodiment and/or variations thereof. FIGS. 16, 18, 20, 22, and 24 are cross-sectional views taken along the line B-B of FIGS. 17, 19, 21, 23 and 25.

Figure 16:
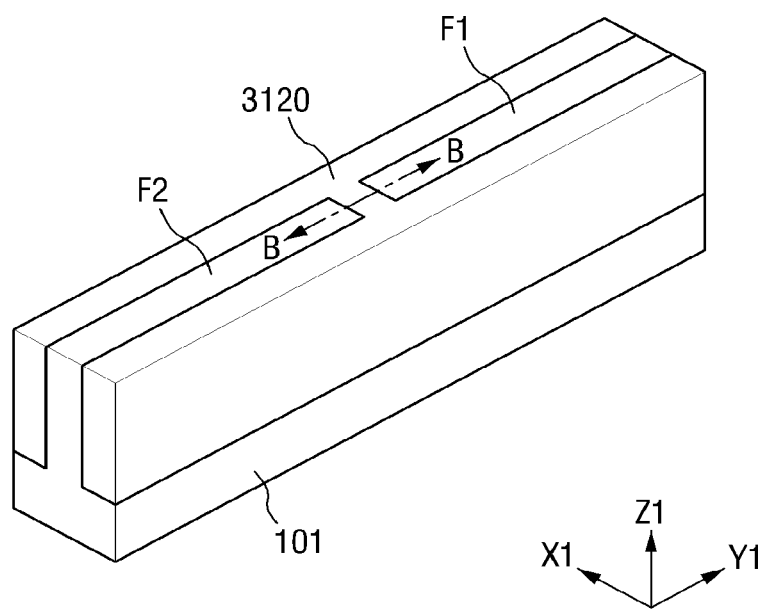
FIGS. 16 to 25 illustrate intermediate process steps of a fabricating method of a semiconductor device according to a first embodiment of the present invention.
Figure 17:
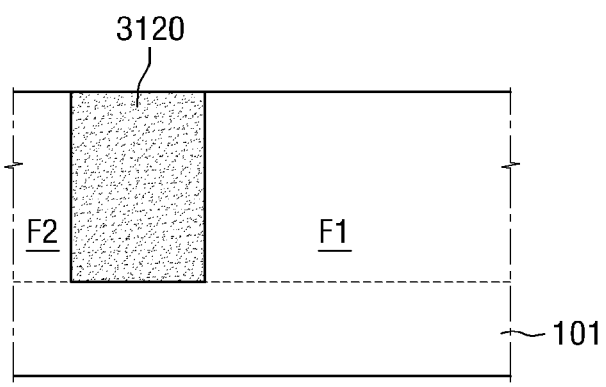

First, referring to FIGS. 16 and 17, a first fin F1 and a second fin F2 adjacent to each other are formed lengthwise in a substrate 101. In particular, the first fin F1 and the second fin F2 are aligned end to end along the same axis. Next, an insulation film 3120 is formed between the first fin F1 and the second fin F2. The insulation film 3120 is also formed on the sides of the first fin F1 and F2 (such as major sides M1 and M2 described above with respect to the first embodiment). The insulation film 3120 may be formed in trenches, such as trenches 501 and 502 described with respect to the first embodiment, defined by sides of fins F1 and F2 and neighboring fins (see also FIG. 1B, e.g.) Here, the insulation film 3120 may be an oxide film, a nitride film, an oxynitride film, or a combination thereof.

Figure 18:
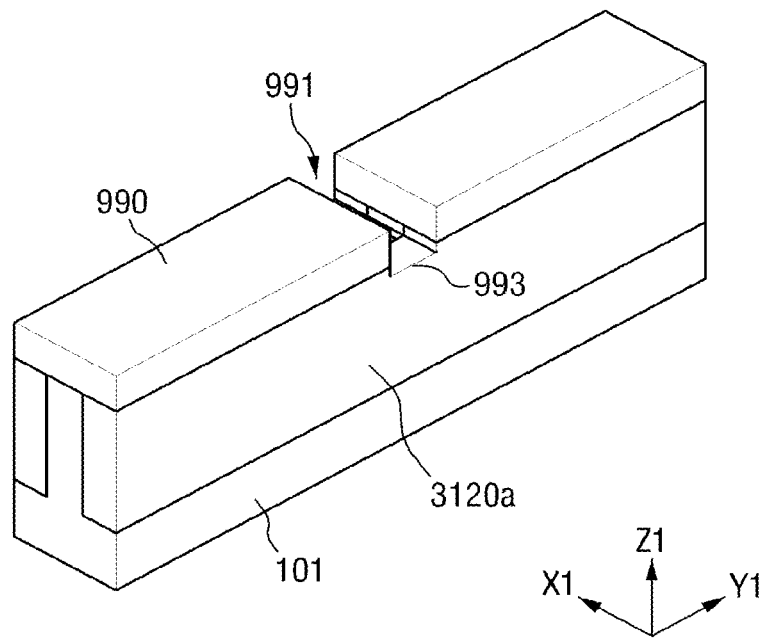
Figure 19:
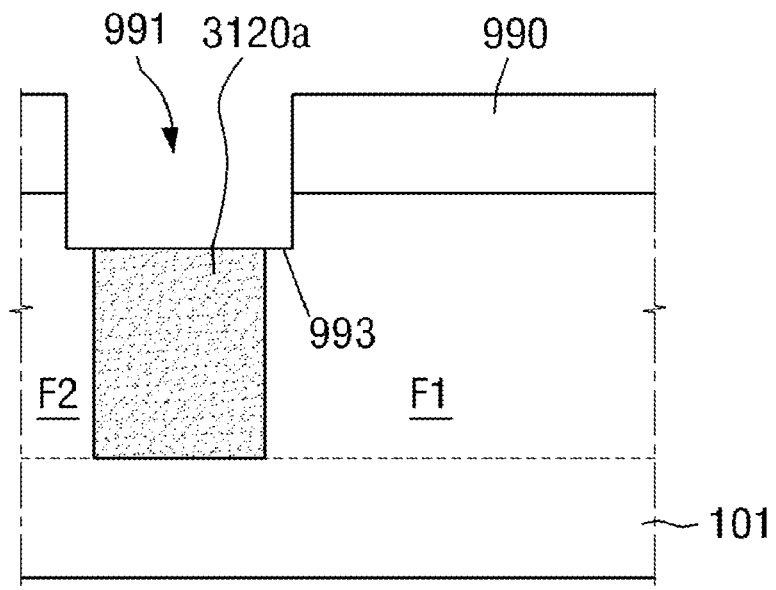

Referring to FIGS. 18 and 19, a mask pattern 990 including an opening 991 is formed on the first fin F1, the second fin F2 and the insulation film 3120. The opening 991 may extend over a trench defined between end sidewalls of fins F1 and F2 (e.g., trench 502a in FIG. 4). The opening 991 may have a width to extend over the ends (e.g., the sidewall ends) of fins F1 and F2. The mask pattern 990 may comprise a linear opening and extend over multiple fins. For example, the mask pattern may comprise a linear opening corresponding to second part 112 shown in FIG. 1B, extending over trenches formed between ends of adjacent fins. The mask pattern may have a width to extend over end portions (e.g., sidewalls of ends) of fins F1_1/F2_1, F1_2/F2_2, and F3_1/F3_2. The mask pattern 990 may be formed by depositing a mask layer and selectively etching the same with a patterned photoresist layer. Here, a height of the mask pattern 990 may be determined in consideration of the steps of planarization (see FIGS. 20 and 21) and a field recess process (see FIGS. 24 and 25). The mask pattern 990 may include a material having etch selectivity with respect to the insulation film 3120. When the insulation film 3120 is an oxide film, the mask pattern 990 may be a nitride film. The opening 991 may be linear.

Next, a trench 993 is formed by removing a portion of the first fin F1, a portion of the second fin F2 and a portion of the insulation film 3120 using the mask pattern 990. For example, the trench 993 may be formed by dry etching. Alternatively, this step may be omitted, resulting in a lower surface of insulation film 3121 (subsequently formed as described below) formed at a height of the top surfaces of fins F1 and F2.

Figure 20:
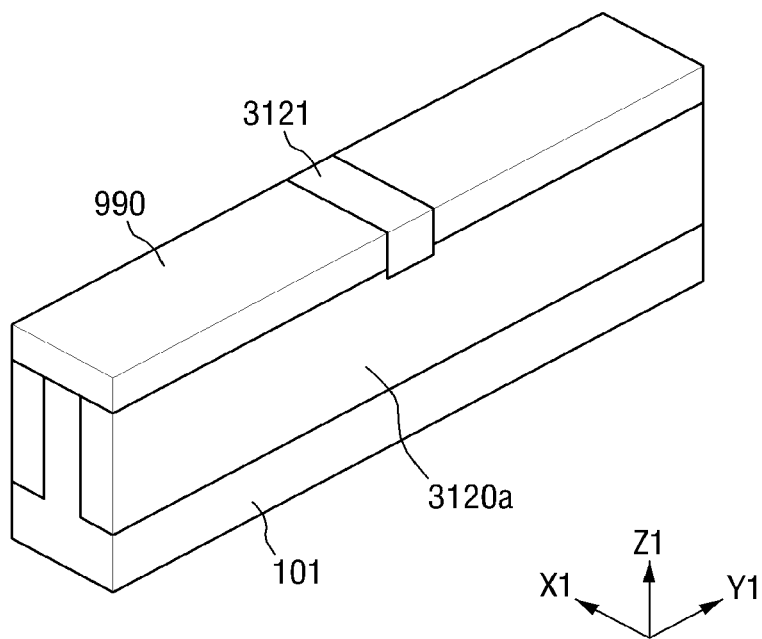
Figure 21:
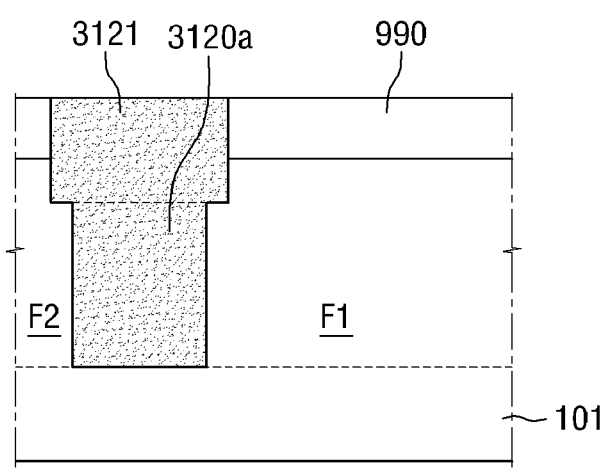

Referring to FIGS. 20 and 21, an insulation film 3121 filling the trench 993 and the opening 991 is formed.

In detail, the insulation film 3121 is formed on (e.g., deposited on) the mask pattern 990 to sufficiently fill the trench 993 and the opening 991. Next, a top surface of the insulation film 3121 and a top surface of the mask pattern 990 are planarized. The insulation film 3121 may be the same material as the insulation film 3120, but aspects of the present invention are not limited thereto.

Figure 22:
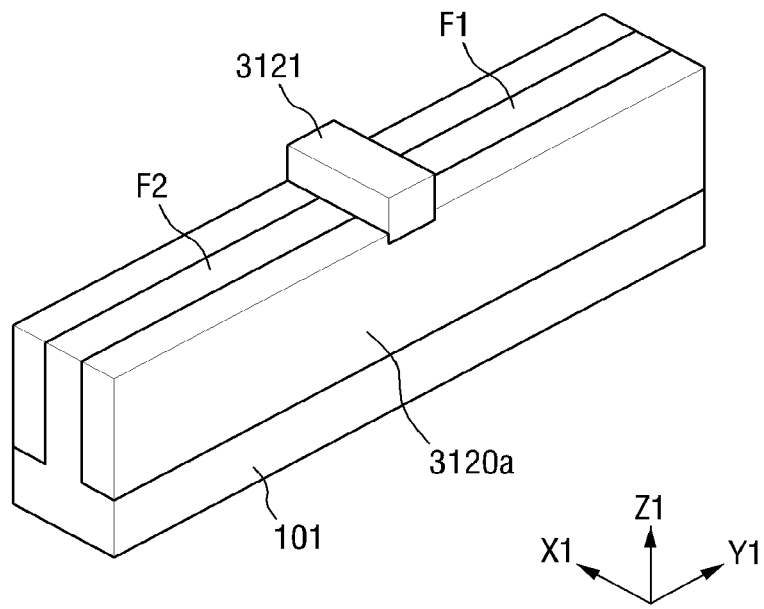
Figure 23:
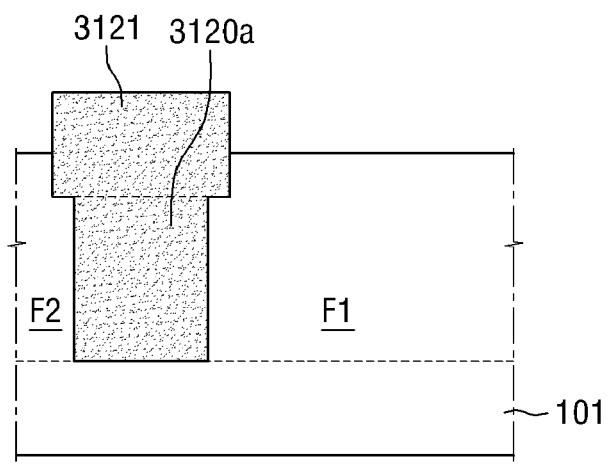

Referring to FIGS. 22 and 23, the mask pattern 990 is removed. For example, the mask pattern 990 may be removed by wet etching.

Figure 24:
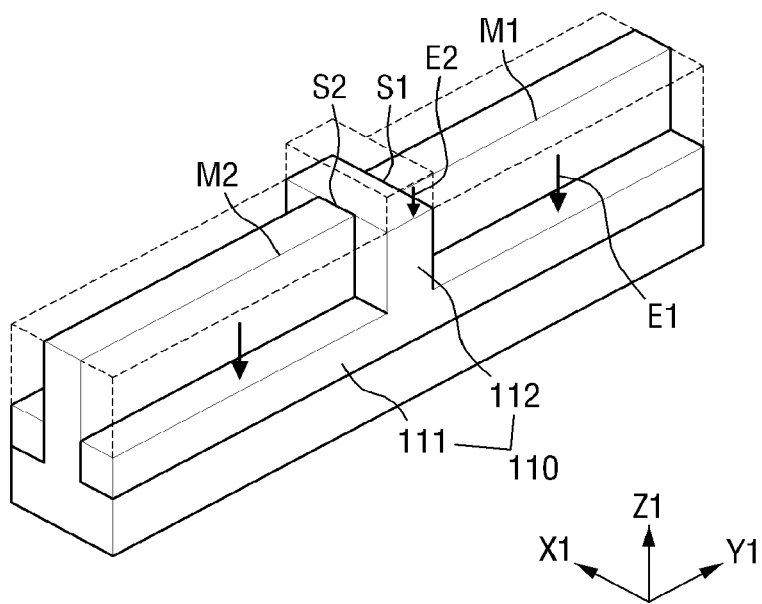
Figure 25:
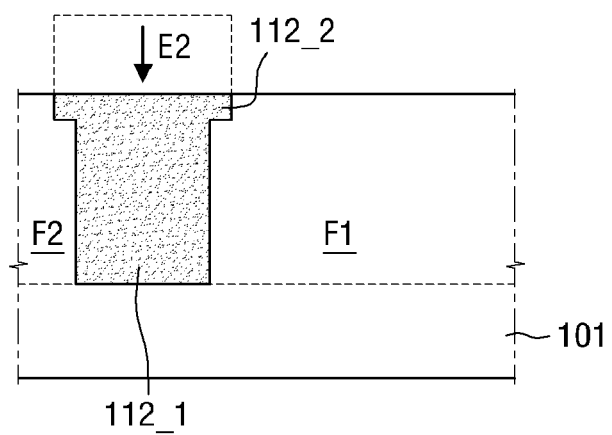

Referring to FIGS. 24 and 25, a field recess process is performed. At least portions of insulation films 3120a and 3121, a portion of the first fin F1 and a portion of the second fin F2 may be simultaneously removed. Specifically, portions of insulation film 3120a not under insulation film 3121, such as adjacent long sides M1 and M2 in trench 501, may be partially etched. As the result, a height of the insulation film 3120a adjacent long sides M1 and M2 of the fins F1 and F2 is reduced, as indicated by E1, and a first part 11 of the field insulation film 110 is formed. In addition, a height of the insulation film 3121 is reduced, as indicated by E2, and a second part 112 of the field insulation film 110 is formed.

Here, the second part 112 may be T-shaped. The second part 112 may comprise a first insulation film 112_1 and a second insulation film 112_2 connected to the first insulation film 112_1 having a width (with respect to the cross section shown in FIG. 25) less than a width of the second insulation film 112_2. Alternatively, all of insulation film 3121 may be removed and thus the second insulation film 112_2 of the second part 112 may not be formed as part of the final device. This alternative process may be used to make the second device 2 of FIG. 8 and embodiments including this device or variations thereof (such as devices 6 and 7, and more specifically, the portions in regions in V and VI in FIGS. 13 and 14, respectively). This alternative also may be achieved when etching of insulation film 3120 and fins F1 and F2 is omitted as described with respect to FIGS. 18 and 19. In addition, when etching of insulation film 3120 and fins F1 and F2 is omitted (as described with respect to FIGS. 18 and 19) and only part of insulation film 3121 is removed, a T-shaped second part 112 may result, having a second part 112_2 higher than and formed on fins F1 and F2. In such an alternative, removal of mask pattern 990 may include a planarization step followed by a selective etch of a remaining portion of mask pattern 990 remaining on portions of fins F1 and F2.

Referring again to FIGS. 1A, 1B, 2A, 2B, 3, 4A, 5A, 5B, 5C and 6, the dummy gate 247_1 is formed on the second part 112 of the field insulation film 110, and the plurality of gates 147_1, 147_2, 147_5 and 147_6 are formed on the corresponding fins F1 and F2 so as to cross the corresponding fins F1 and F2.

Figure 26:
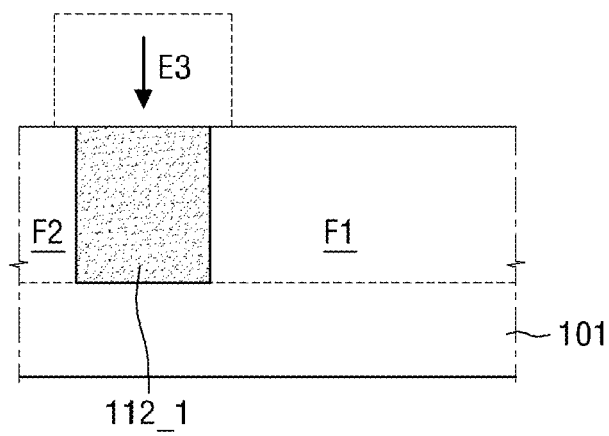
FIG. 26 illustrates intermediate process steps of a fabricating method of a semiconductor device according to a second embodiment of the present invention.

FIG. 26 illustrates intermediate process steps of a fabricating method of a semiconductor device according to a further embodiment of the present invention. The fabricating method represented by FIGS. 26 and 27 may be used to fabricate the second embodiment discussed with respect to FIG. 8 and those embodiments incorporating the second device 2 shown in FIG. 8 and/or variations thereof.

Like the fabricating method of the semiconductor device according to the first embodiment, the fabricating method of the semiconductor device according to the second embodiment includes intermediate process steps shown in FIG. 16 to 23 (or its described alternatives).

Referring to FIG. 26, the field recess process is performed. That is to say, at least portions of insulation films 3120a and 3121, a portion of the first fin F1 and a portion of the second fin F2 may be simultaneously removed. As the result, a height of the insulation film 3121 is reduced, as indicated by E3, and a second part 112 of a field insulation film 110 is formed. Here, the second part 112 may have a cross section in the shape of a quadrilateral (e.g., rectangular or trapezoidal).

The reason of the foregoing is that the field recess process is progressed more than is shown in FIG. 25, so that the second insulation film (112_2 of FIG. 25) of the second part 112 is not formed in the final product.

Figure 27:
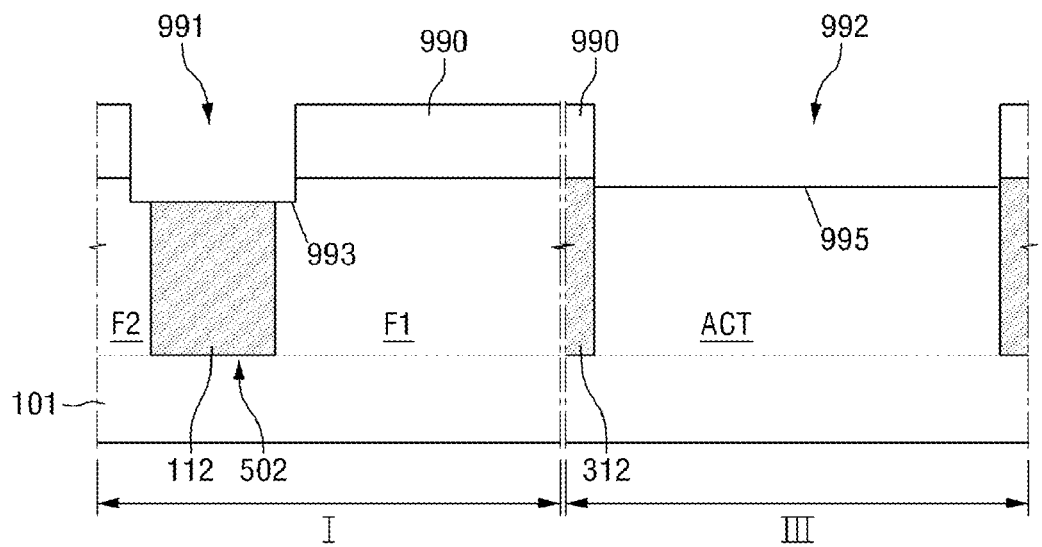
FIG. 27 illustrates intermediate process steps of a fabricating method of a semiconductor device according to a second embodiment of the present invention.

FIG. 27 illustrates intermediate process steps of a fabricating method of a semiconductor device according to a second embodiment of the present invention. The following description will focus on differences between the present embodiment and the previous embodiment shown in FIGS. 16 to 25. In this embodiment, the mask pattern 990 shown in FIG. 19 is modified.

Referring to FIG. 27, the mask pattern 990 includes an opening 991 exposing a portion of a first fin F1, a portion of a second fin F2 and an insulation film 3120a in a first region I, and an opening 992 exposing a wide active region ACT in a third region III. The active region ACT may be a planar active region. When etching trench 993 in the first region I using the mask pattern 990, a surface 995 of the active region ACT in the second region II is also etched and lowered. The opening 992 is substantially larger than the opening 991. Therefore, after performing an etching process using the mask pattern 990, the trench 993 may be formed to have a bottom deeper than the height of surface 995 of the active region ACT.

Next, an insulation film filling the openings 991 and 992 and the trench 993 is formed.

Then, the mask pattern 990 is removed as described with respect to FIGS. 22 and 23.

Next, the field recess process is performed as described with respect to FIGS. 24 and 25.

While the present invention has been particularly shown and described with reference to exemplary embodiments thereof, it will be understood by those of ordinary skill in the art that various changes in form and details may be made therein without departing from the spirit and scope of the present invention as defined by the following claims. It is therefore desired that the present embodiments be considered in all respects as illustrative and not restrictive, reference being made to the appended claims rather than the foregoing description to indicate the scope of the invention.

What is claimed is:

1. A semiconductor device comprising:
a semiconductor substrate with a first semiconductor fin and a second semiconductor fin, the first and second semiconductor fins extending, with respect to a top down view, in a first direction and extending along a same line and defining a first recess between facing ends of the first and second semiconductor fins; and
an insulator pattern formed in the first recess,
wherein the first recess includes a first trench having a first width, and a second trench having a second width greater than the first width, and one end of the first trench is connected with one end of the second trench and the connected portion is rounded.

2. The semiconductor device of claim 1, wherein the insulator pattern has a substantially "T" shape.

3. The semiconductor device of claim 1, wherein the insulator pattern includes a first part filling the first trench, and a second part filling the second trench.

4. The semiconductor device of claim 3, the second trench has a rounded bottom surface and the second part is on the rounded bottom surface of the second trench.

5. The semiconductor device of claim 3, further comprising:
a gate electrode extending along a first sidewall of the first semiconductor fin, the top surface of the first semiconductor fin and a second sidewall of the first semiconductor fin;
a dummy gate electrode formed on the second part of the insulator pattern at the first recess;
wherein with respect to the top down view, the gate electrode and the dummy gate electrode extend in a second direction crossing the first direction.

6. The semiconductor device of claim 5, wherein a bottom surface of the dummy gate electrode is at least as high as the top surface of the first semiconductor fin.

7. The semiconductor device of claim 3, wherein a top surface of the second part and top surfaces of the first and second fins have substantially same height.

8. The semiconductor device of claim 1, further comprising:
epitaxial layers formed on the first and second semiconductor fins,
wherein the epitaxial layers protrude from an upper surfaces of the first and second semiconductor fins.

9. A semiconductor device comprising:
a semiconductor substrate with a first region and a second region,
the first region includes a first semiconductor fin and a second semiconductor fin, the first and second semiconductor fins extending, with respect to a top down view, in a first direction and extending along a same line and defining a first recess between facing ends of the first and second semiconductor fins,
the second region includes a third semiconductor fin and a fourth semiconductor fin, the third and fourth semiconductor fins extending, with respect to the top down view, in a second direction and extending along a same line and defining a second recess between facing ends of the third and fourth semiconductor fins;
a first insulator pattern formed in the first recess; and
a second insulator pattern formed in the second recess,
wherein with respect to the top down view, the first insulator pattern extends in a third direction crossing the first direction, and the second insulator pattern extends in a fourth direction crossing the second direction,
wherein with respect to a first cross section of the first insulator pattern taken in a direction perpendicular to the third direction at the first recess, the first insulator pattern has a substantially "T" shape, and with respect to a second cross section of the second insulator pattern taken in a direction perpendicular to the fourth direction at the second recess, the second insulator pattern has a substantially "T" shape.

10. The semiconductor device of claim 9, wherein an upper surface of the first insulator pattern and an upper surface of the second insulator pattern have substantially same height.

11. The semiconductor device of claim 10, wherein the upper surface of the first insulator pattern and upper surfaces of the first and second semiconductor fins have substantially same height, and the upper surface of the second insulator pattern and upper surfaces of the third and fourth semiconductor fins have substantially same height.

12. The semiconductor device of claim 9, wherein the first and second insulator patterns are in the same logic region.

13. The semiconductor device of claim 9, wherein one of the first and second insulator patterns is in a logic region and the other one of the first and second insulator patterns is in a memory region.

14. The semiconductor device of claim 9, wherein the first insulator pattern includes a first part having a first width, and a second part having a second width greater than the first width, the second part has a rounded bottom surface.

15. A semiconductor device comprising:
a semiconductor substrate with a first semiconductor fin and a second semiconductor fin, the first and second semiconductor fins extending, with respect to a top down view, in a first direction and extending along a same line and defining a first recess between facing ends of the first and second semiconductor fins, the first recess includes a first trench having a first width, and a second trench having a second width greater than the first width;
an insulator pattern formed in the first recess, the insulator pattern includes a first part filling the first trench, and a second part filling the second trench; and
a dummy gate electrode formed on the second part of the insulator pattern at the first recess, the dummy gate electrode is misaligned with respect to an imaginary line vertically extending a center portion of the second part.

16. The semiconductor device of claim 15, wherein a portion of the dummy gate overlaps the second part and does not overlap the first part.

17. The semiconductor device of claim 15, wherein the second part has a rounded bottom surface.

18. A semiconductor device comprising:
a semiconductor substrate with a first semiconductor fin and a second semiconductor fin, the first and second semiconductor fins extending, with respect to a top down view, in a first direction and extending along a same line and defining a first recess between facing ends of the first and second semiconductor fins; and
an insulator pattern formed in the first recess,
wherein with respect to the top down view, the insulator pattern extends in a second direction crossing the first direction,
wherein with respect to a first cross section of the first insulator pattern taken in a direction perpendicular to the second direction at the first recess, the insulator pattern has a substantially "T" shape, and an upper surface of the insulator pattern and upper surfaces of the first and second semiconductor fins have substantially a same height.

19. The semiconductor device of claim 18, wherein the insulator pattern includes a first part having a first width, and a second part having a second width greater than the first width, the second part has a rounded bottom surface.

* * * * *